(12) United States Patent
Lee et al.

(10) Patent No.: US 12,471,342 B2
(45) Date of Patent: Nov. 11, 2025

(54) NFET WITH ALUMINUM-FREE WORK-FUNCTION LAYER AND METHOD FORMING SAME

(71) Applicant: Taiwan Semiconductor Manufacturing Co., Ltd., Hsinchu (TW)

(72) Inventors: Hsin-Yi Lee, Hsinchu (TW); Weng Chang, Hsinchu (TW); Chi On Chui, Hsinchu (TW); Chun-I Wu, Taipei (TW); Huang-Lin Chao, Hillsboro, OR (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 574 days.

(21) Appl. No.: 17/648,152

(22) Filed: Jan. 17, 2022

(65) Prior Publication Data

US 2023/0020099 A1   Jan. 19, 2023

Related U.S. Application Data

(60) Provisional application No. 63/266,426, filed on Jan. 5, 2022, provisional application No. 63/222,023, filed on Jul. 15, 2021.

(51) Int. Cl.
  *H10D 64/01*   (2025.01)
  *H01L 21/28*   (2025.01)
  (Continued)

(52) U.S. Cl.
  CPC ....... *H10D 64/01* (2025.01); *H01L 21/28088* (2013.01); *H01L 21/28568* (2013.01);
  (Continued)

(58) Field of Classification Search
  CPC ............ H01L 29/401; H01L 29/42392; H01L 21/28088; H01L 21/28568; H01L 29/66545; H01L 29/0673
  See application file for complete search history.

(56) References Cited

U.S. PATENT DOCUMENTS 4,378,460 A *  3/1983  Williams ............. H10F 77/211
                                                          136/258
8,304,841 B2  11/2012  Xu et al.
(Continued)

FOREIGN PATENT DOCUMENTS

CN  113053753 A  6/2021
KR  20110082186 A  7/2011
(Continued)

OTHER PUBLICATIONS

Vitale, Steven & Kedzierski, Jakub & Healey, Paul & Wyatt, Peter & Keast, Craig. (2011). Work-Function-Tuned TiN Metal Gate FDSOI Transistors for Subthreshold Operation. Electron Devices, IEEE Transactions on. 58. 419-426. 10.1109/TED.2010.2092779. (Year: 2011).*

*Primary Examiner* — Chad M Dicke
*Assistant Examiner* — Jeremy Daniel Watts
(74) *Attorney, Agent, or Firm* — Slater Matsil, LLP

(57) ABSTRACT

A method includes forming a dummy gate stack over a semiconductor region, forming a source/drain region on a side of the dummy gate stack, removing the dummy gate stack to form a trench, depositing a gate dielectric layer extending into the trench, depositing a metal-containing layer over the gate dielectric layer, and depositing a silicon-containing layer on the metal-containing layer. The metal-containing layer and the silicon-containing layer in combination act as a work-function layer. A planarization process is performed to remove excess portions of the silicon-containing layer, the metal-containing layer, and the gate (Continued)

dielectric layer, with remaining portions of the silicon-containing layer, the metal-containing layer, and the gate dielectric layer forming a gate stack.

18 Claims, 30 Drawing Sheets

(51) Int. Cl.
　　*H01L 21/285* (2006.01)
　　*H10D 30/01* (2025.01)
　　*H10D 30/67* (2025.01)
　　*H10D 62/10* (2025.01)

(52) U.S. Cl.
　　CPC ....... *H10D 30/031* (2025.01); *H10D 30/6739* (2025.01); *H10D 64/017* (2025.01); *H10D 30/6735* (2025.01); *H10D 30/6757* (2025.01); *H10D 62/118* (2025.01)

(56) References Cited

U.S. PATENT DOCUMENTS

| | | | |
|---|---|---|---|
| 8,415,753 B2 | 4/2013 | Nakagawa et al. | |
| 8,586,436 B2 | 11/2013 | Ng et al. | |
| 11,502,185 B2 | 11/2022 | Hsiao et al. | |
| 11,587,791 B2 | 2/2023 | Wang et al. | |
| 11,757,023 B2 | 9/2023 | Shen et al. | |
| 2018/0315652 A1* | 11/2018 | Tsai | H01L 21/76895 |
| 2020/0152746 A1* | 5/2020 | Tsau | H10D 30/024 |
| 2020/0294866 A1* | 9/2020 | Cheng | H10D 30/6757 |
| 2022/0059668 A1* | 2/2022 | Mokhtarzadeh | H01L 21/28194 |

FOREIGN PATENT DOCUMENTS

| | | |
|---|---|---|
| KR | 20200047295 A | 5/2020 |
| KR | 20210065838 A | 6/2021 |
| TW | 201110324 A | 3/2011 |
| TW | 201349310 A | 12/2013 |

\* cited by examiner

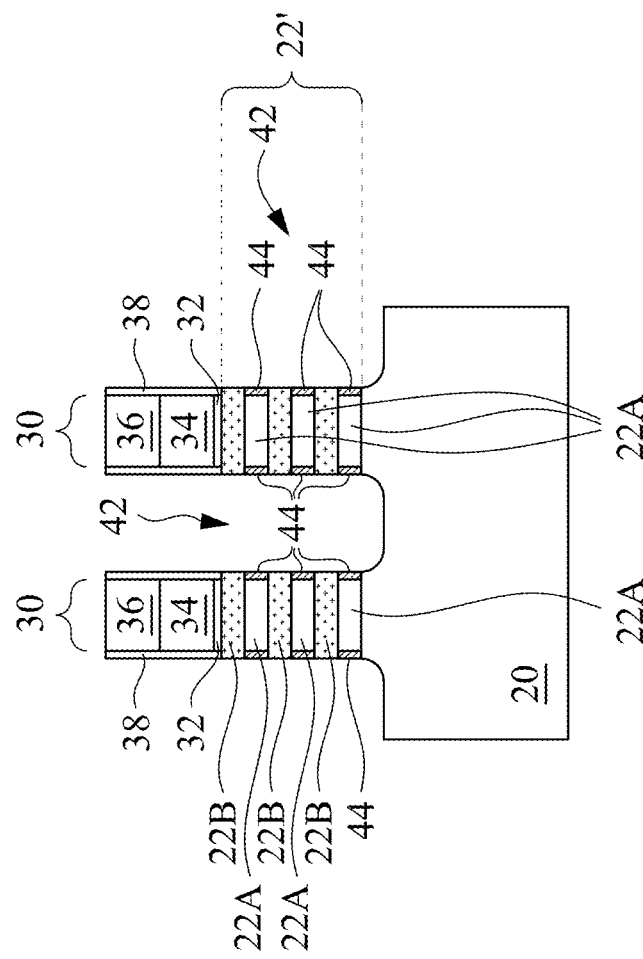
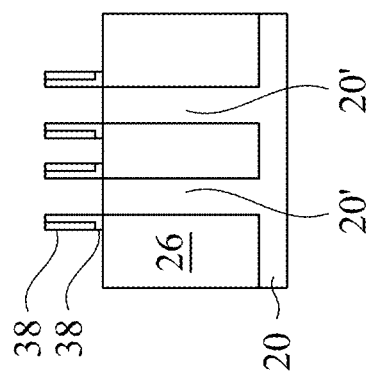
FIG. 8A
FIG. 8B

NFET WITH ALUMINUM-FREE WORK-FUNCTION LAYER AND METHOD FORMING SAME

PRIORITY CLAIM AND CROSS-REFERENCE

This application claims the benefit of the following provisionally filed U.S. patent application: Application No. 63/222,023, filed on Jul. 15, 2021, and entitled "New NFET Work-Function Metal Material (TiN+Si)," and Application No. 63/266,426, filed on Jan. 5, 2022, and entitled "NFET Work-Function Metal Material (TiN+Si), and Method of WFM TiN+Si insitu Glue layer for Nanosheet Rg Reduction," which applications are hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (for example, transistors, diodes, resistors, capacitors, etc.) through continual reduction in minimum feature size, which allows more components to be integrated into a given chip area. As the minimum feature sizes are reduced, however, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 6A, 6B, 7A, 7B, 8A, 8B, 9A, 9B, 10A, 10B, 10C, 11A, 11B, 12A, 12B, 12C, 13A, 13B, 13C, 14A, 14B, 14C, 15A, 15B, 16A, 16B, 17A, 17B, 17C, 17D, 17E, 18A, 18B, 18C, 19A, 19B, and 19C illustrate various views of intermediate stages in the formation of a Gate All-Around (GAA) transistor in accordance with some embodiments.

DETAILED DESCRIPTION

Figure 1:
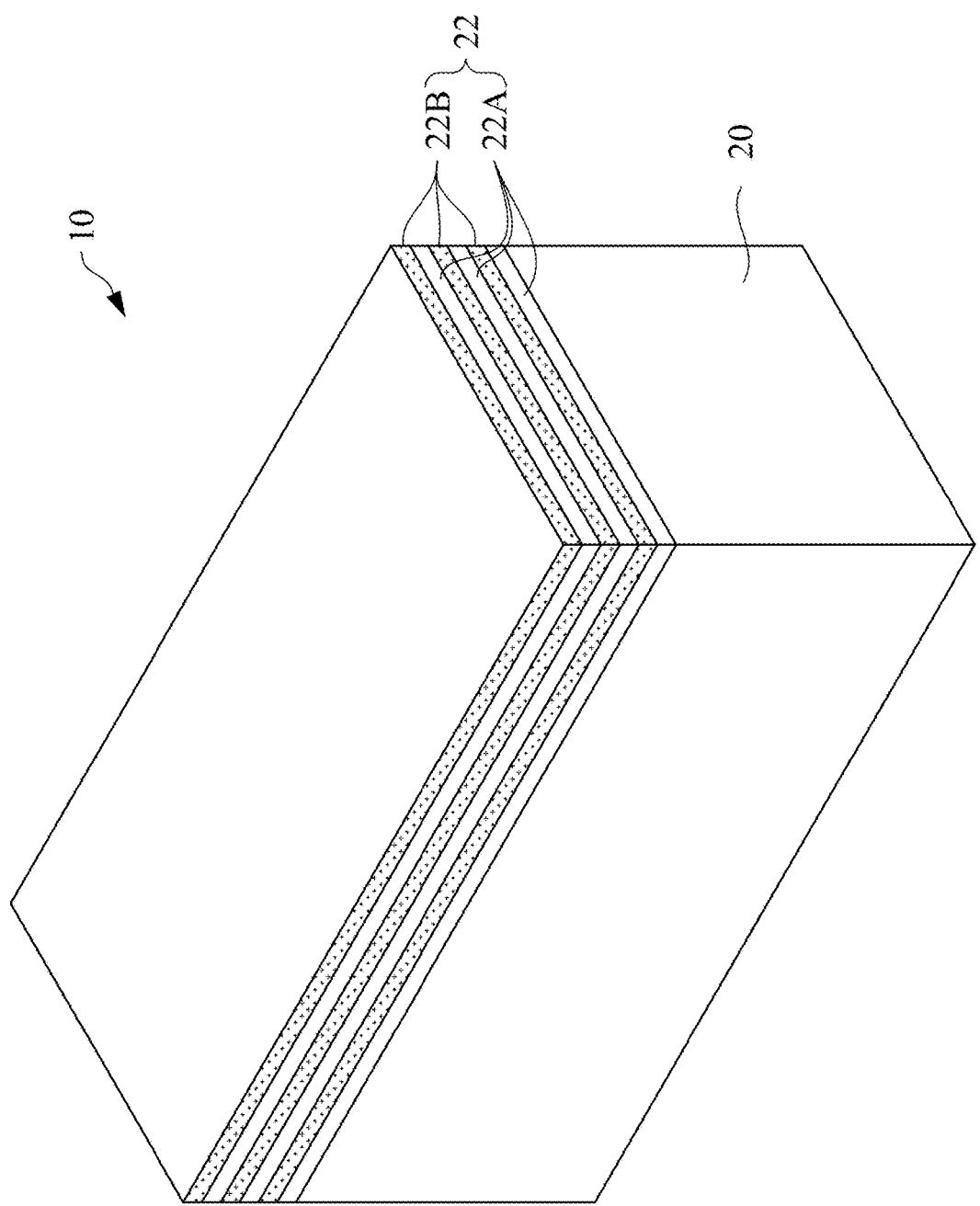

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming a replacement gate stack having an aluminum-free work-function layer and the structure of the corresponding transistor are provided. In accordance with some embodiments, the replacement gate stack includes aluminum-free work-functional layers, which include an aluminum-free metal-containing layer, and a silicon layer over the aluminum-free metal-containing layer. Silicon may result in the reduction of the work-function of the aluminum-free metal-containing layer. Since aluminum may cause the degradation of the reliability of the resulting gate stack, by forming aluminum-free work-function layers, the reliability of the gate stacks is improved. In the description of the present disclosure, an n-type Gate All-Around (GAA) transistor is discussed to explain the concept of the present disclosure. The embodiments of the present disclosure may also be applied to other types of transistors such as Fin Field-Effect Transistors (FinFETs), planar transistors, and the like. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 24:
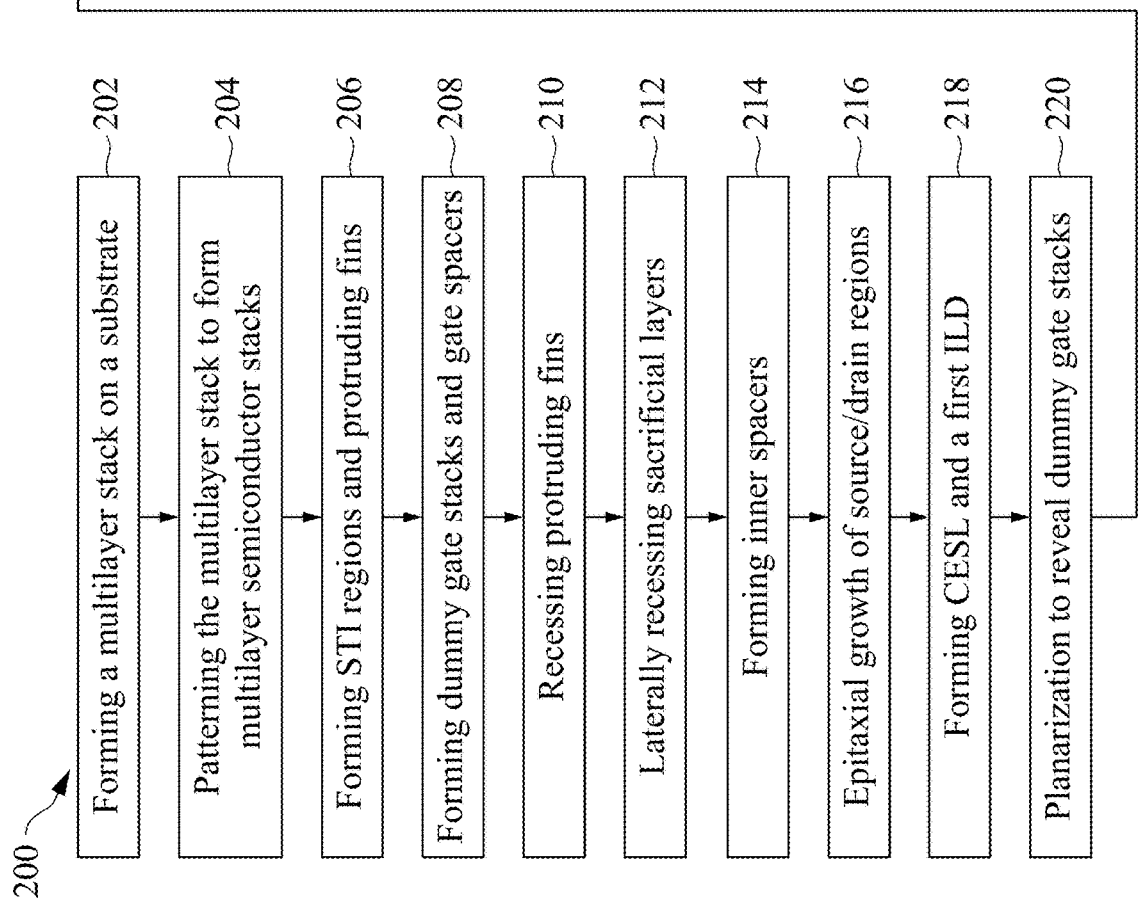
FIG. 24 illustrates a process flow for forming a GAA transistor in accordance with some embodiments.

FIGS. 1-4, 5A, 5B, 6A, 6B, 7A, 7B, 8A, 8B, 9A, 9B, 10A, 10B, 10C, 11A, 11B, 12A, 12B, 12C, 13A, 13B, 13C, 14A, 14B, 14C, 15A, 15B, 16A, 16B, 17A, 17B, 17C, 17D, 17E, 18A, 18B, 18C, 19A, 19B, and 19C illustrate various views of intermediate stages in the formation of a GAA transistor in accordance with some embodiments of the present disclosure. The corresponding processes are also reflected schematically in the process flow shown in FIG. 24.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

In accordance with some embodiments, multilayer stack 22 is formed through a series of deposition processes for depositing alternating materials. The respective process is illustrated as process 202 in the process flow 200 shown in FIG. 24. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there are some pad oxide layer(s) and hard mask layer(s) (not shown) formed over multilayer stack 22. These layers are patterned, and are used for the subsequent patterning of multilayer stack 22.

Figure 2:
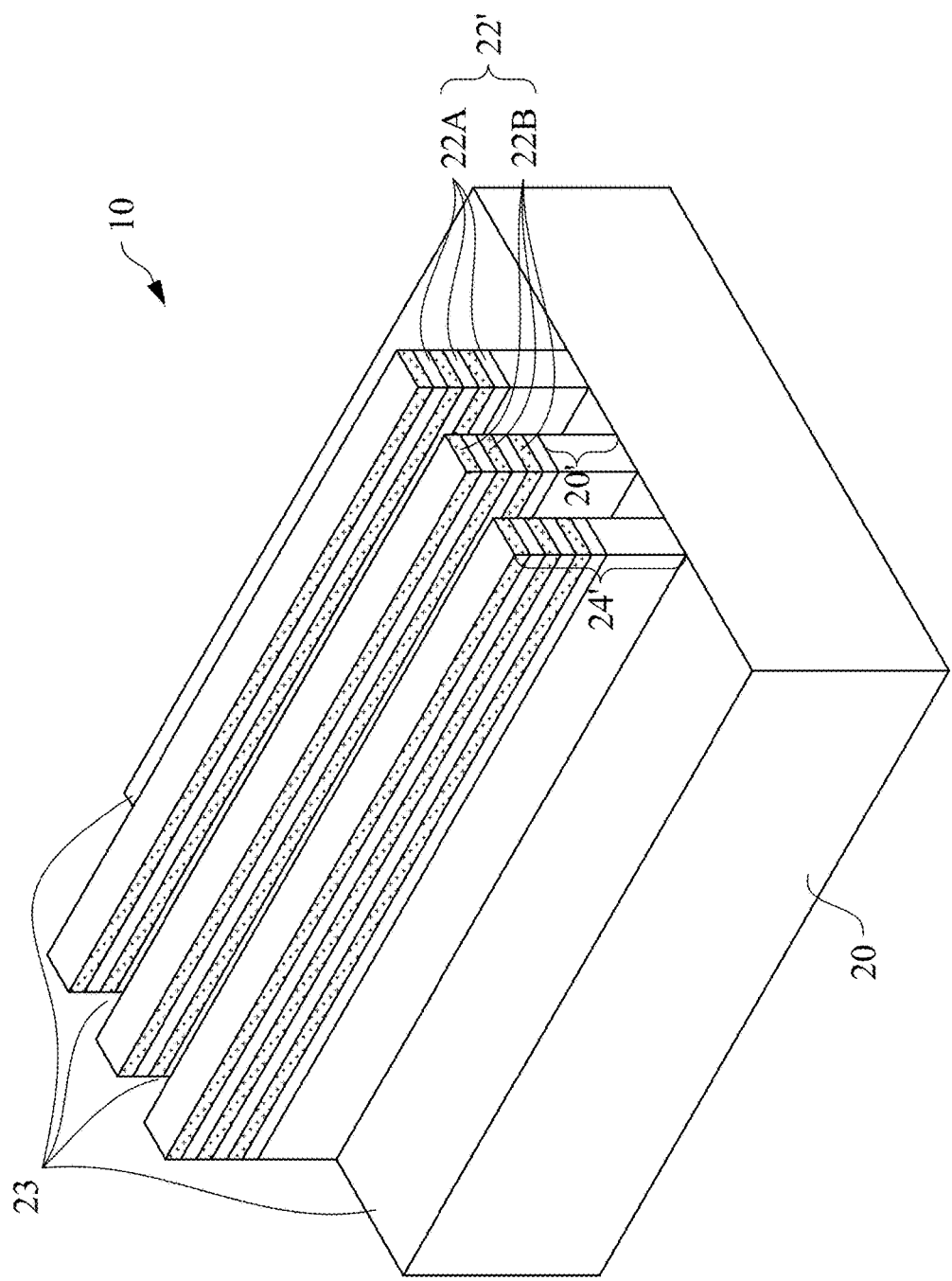

Referring to FIG. 2, multilayer stack 22 and a portion of the underlying substrate 20 are patterned in an etching process(es), so that trenches 23 are formed. The respective process is illustrated as process 204 in the process flow 200 shown in FIG. 24. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
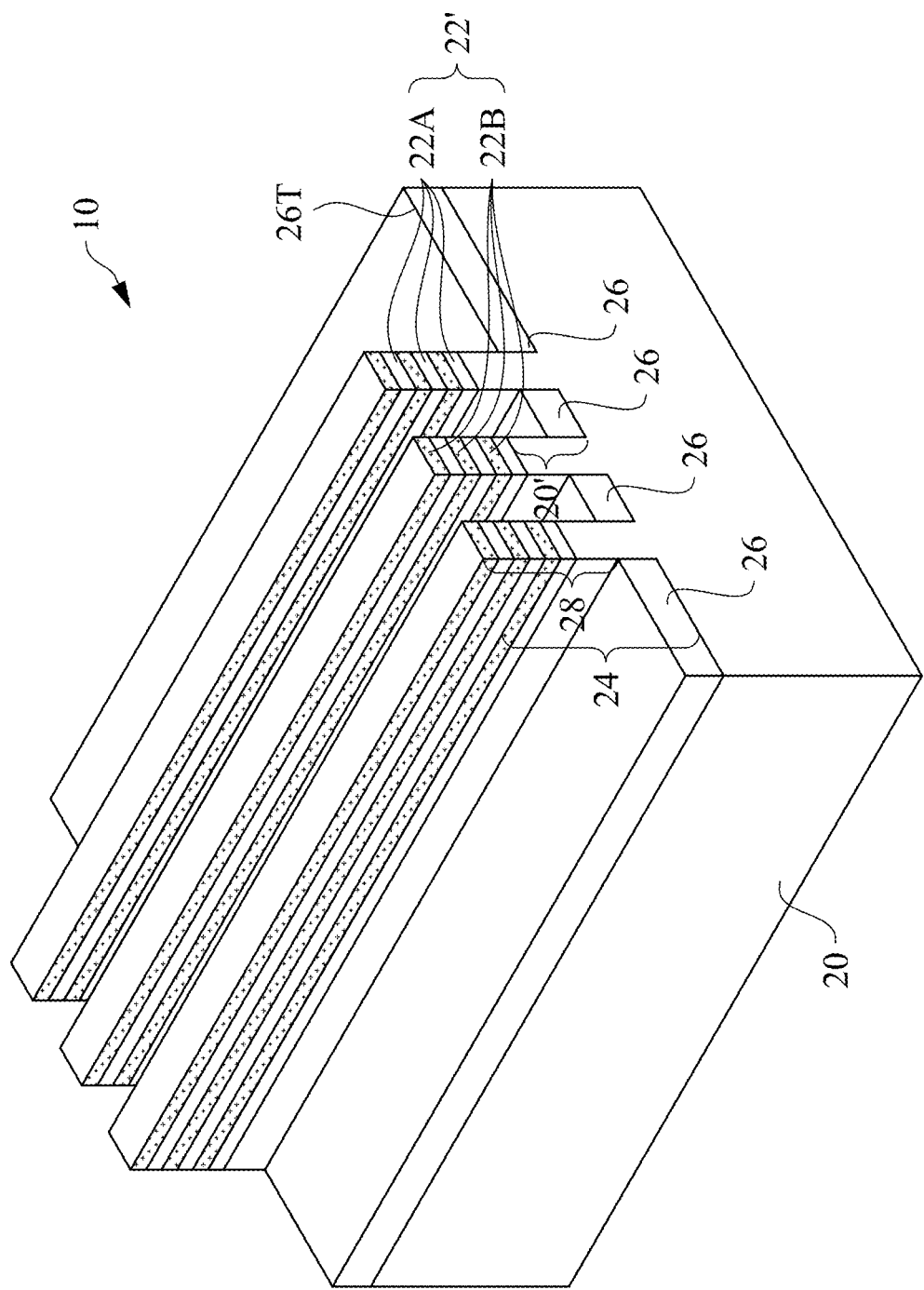

FIG. 3 illustrates the formation of isolation regions 26, which are also referred to as Shallow Trench Isolation (STI) regions throughout the description. The respective process is illustrated as process 206 in the process flow 200 shown in FIG. 24. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multilayer stacks 22' and the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
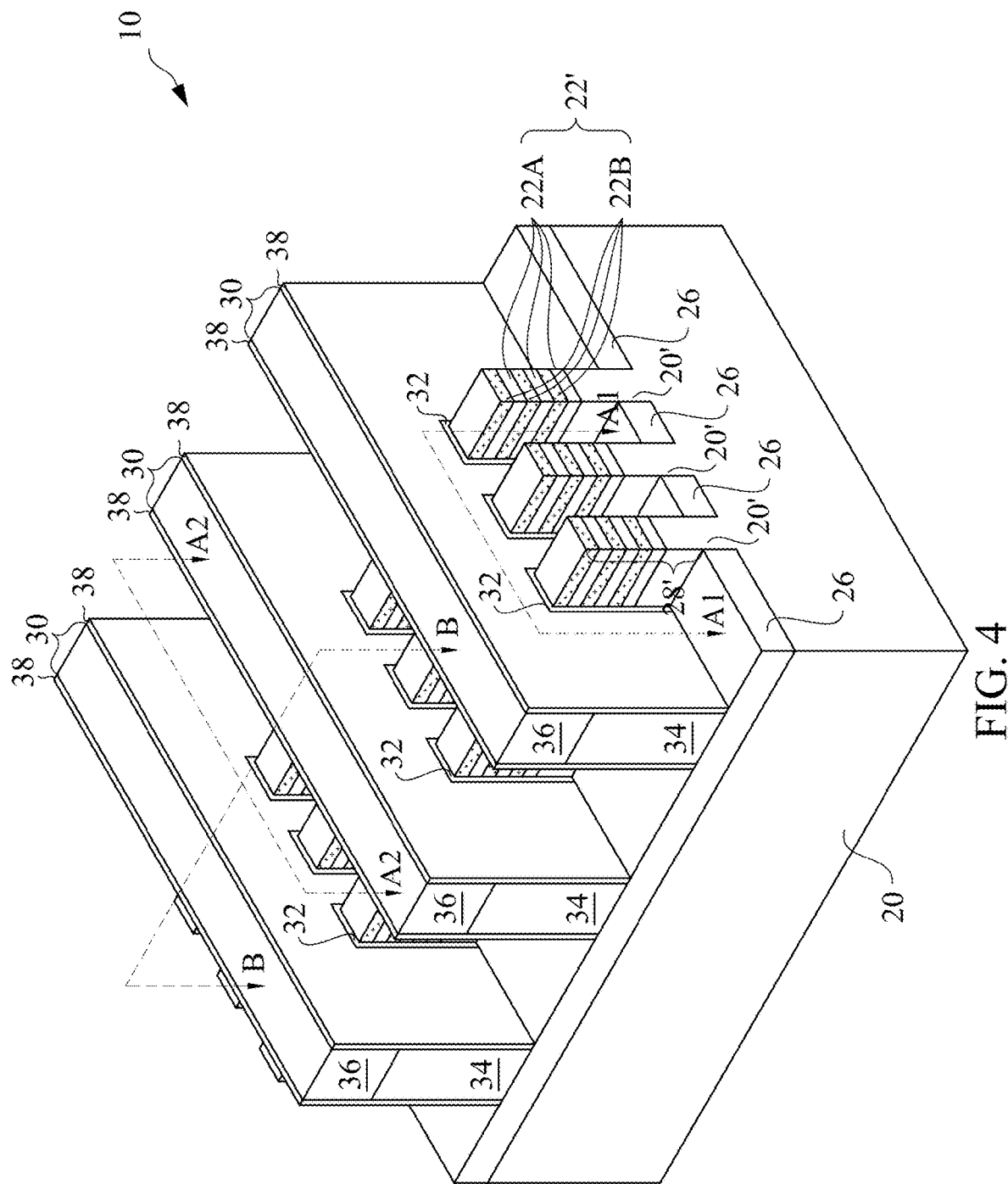

Referring to FIG. 4, dummy gate stacks 30 and gate spacers 38 are formed on the top surfaces and the sidewalls of (protruding) fins 28. The respective process is illustrated as process 208 in the process flow 200 shown in FIG. 24. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a pattering process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 5B:
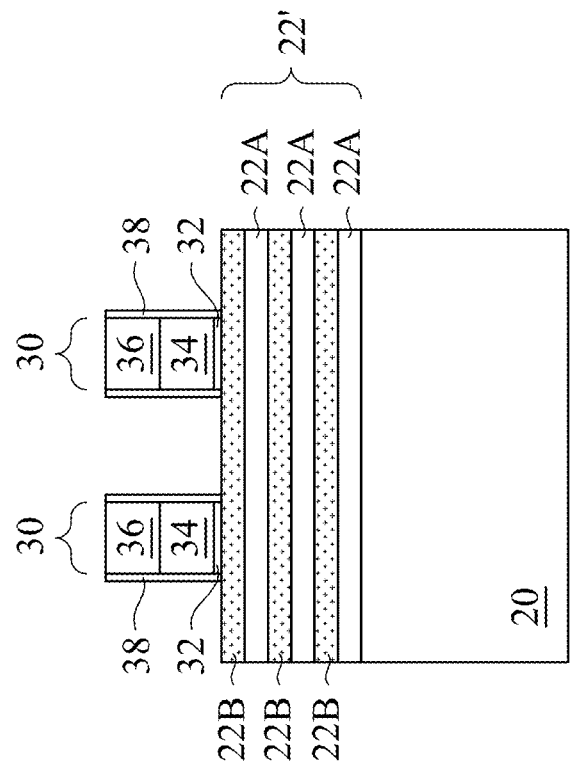
Figure 5A:
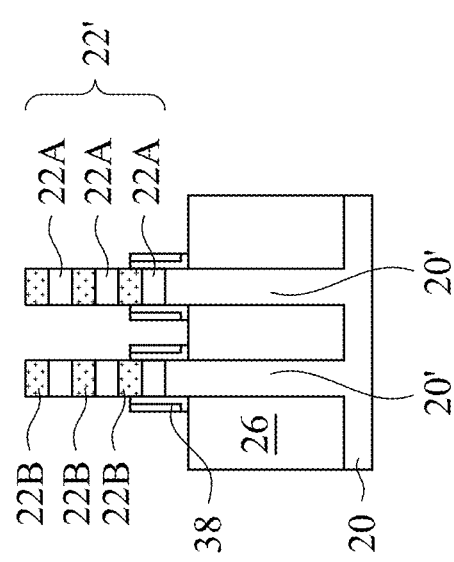

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by the dummy gate stacks 30 and gate spacers 38, and is perpendicular to the gate-length direction. FIG. 5B illustrates the reference cross-section B-B in FIG. 4, which reference cross-section is parallel to the lengthwise directions of protruding fins 28.

Figure 6B:
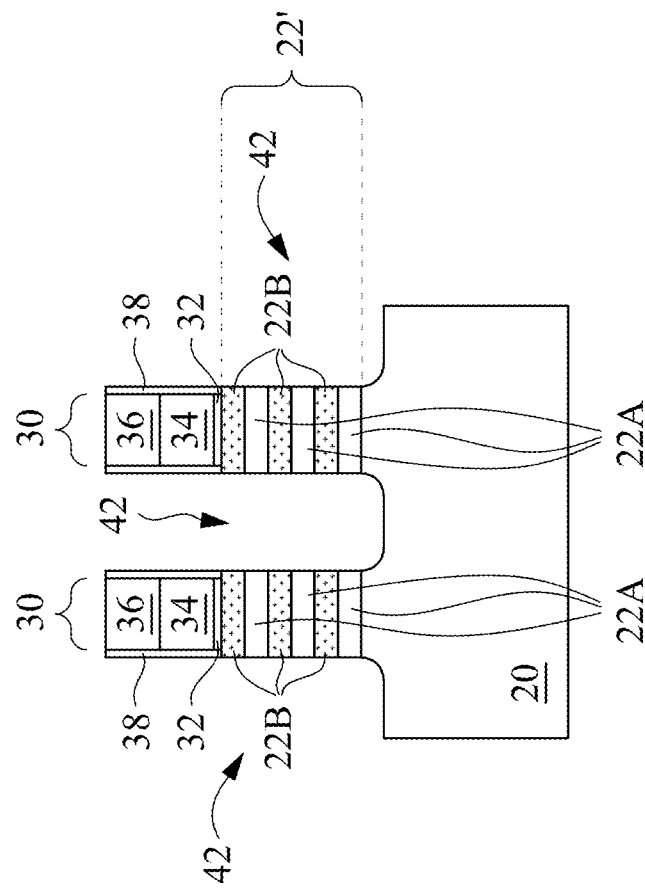
Figure 6A:
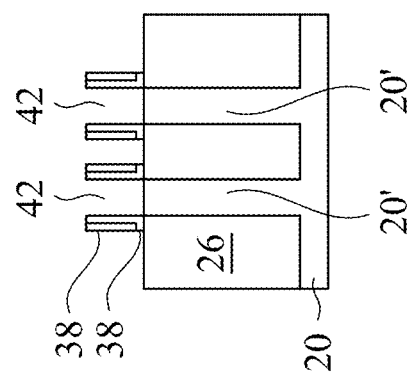

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown in FIG. 24. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer semiconductor stacks 22' and the underlying substrate strips 20'. The bottoms of recesses 42 are at least level with, or may be lower than (as shown in FIG. 6B), the bottoms of multilayer semiconductor stacks 22'. The etching may be anisotropic, so that the sidewalls of multilayer semiconductor stacks 22' facing recesses 42 are vertical and straight, as shown in FIG. 6B.

Figure 7B:
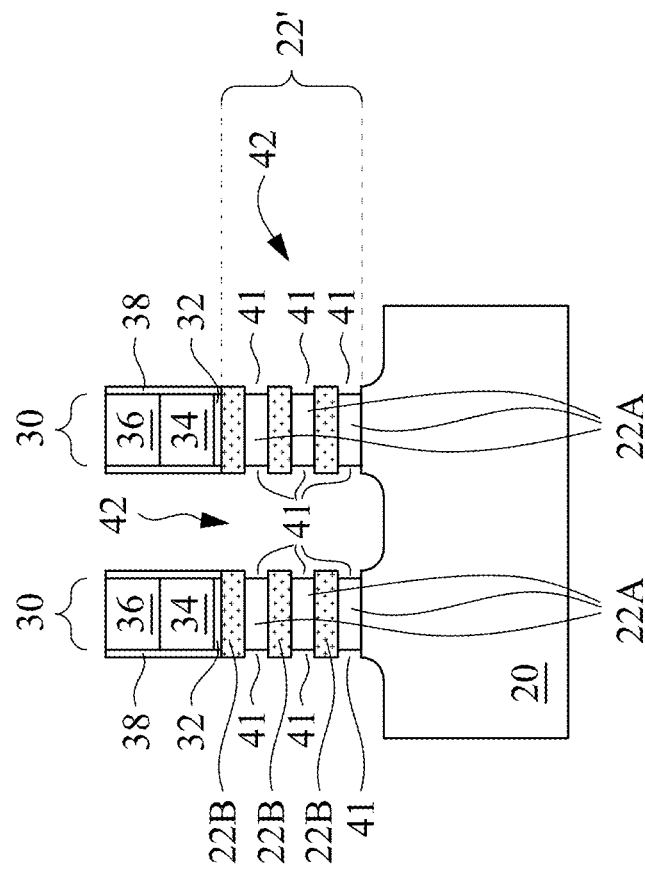
Figure 7A:
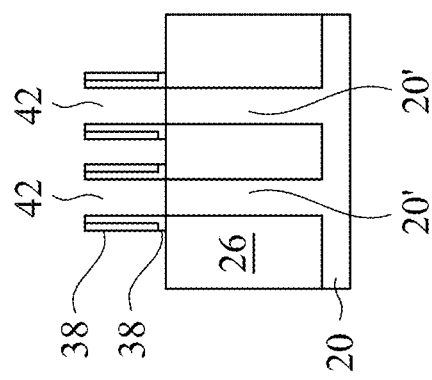

Referring to FIGS. 7A and 7B, sacrificial semiconductor layers 22A are laterally recessed to form lateral recesses 41, which are recessed from the edges of the respective overlying and underlying nanostructures 22B. The respective process is illustrated as process 212 in the process flow 200 shown in FIG. 24. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, or the like, and may be performed using any suitable process temperatures (for example, between about 400° C. and about 600° C.) and a suitable process time (for example, between about 100 seconds and about 1,000 seconds). In accordance with alternative embodiments, the lateral recessing of sacrificial semiconductor layers 22A is performed through an isotropic dry etching process or a combination of a dry etching process and a wet etching process.

FIGS. 8A and 8B illustrate the formation of inner spacers 44. The respective process is illustrated as process 214 in the process flow 200 shown in FIG. 24. The formation process incudes depositing a spacer layer extending into recesses 41, and performing an etching process to remove the portions of inner spacer layer outside of recesses 41, thus leaving inner spacers 44 in recesses 41. Inner spacers 44 may be formed of or comprise SiOCN, SiON, SiOC, SiCN, or the like. Inner spacers 44 may also be porous so that they have a lower-k value lower than, for example, about 3.5. In accordance with some embodiments, the etching of the spacer layer may be performed through a wet etching process, in which the etching chemical may include $H_2SO_4$, diluted HF, ammonia solution ($NH_4OH$, ammonia in water), or the like, or combinations thereof.

Figure 9B:
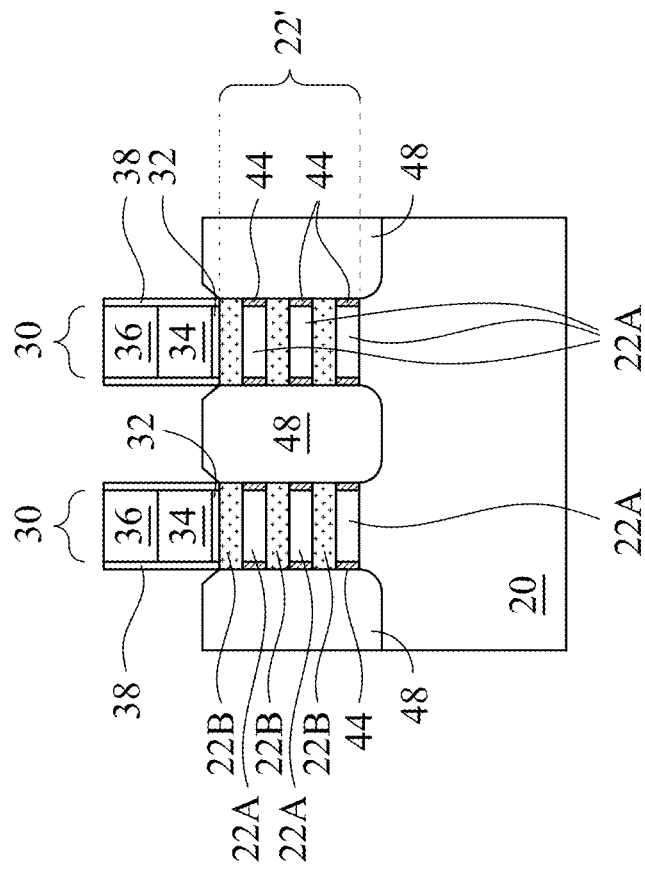
Figure 9A:
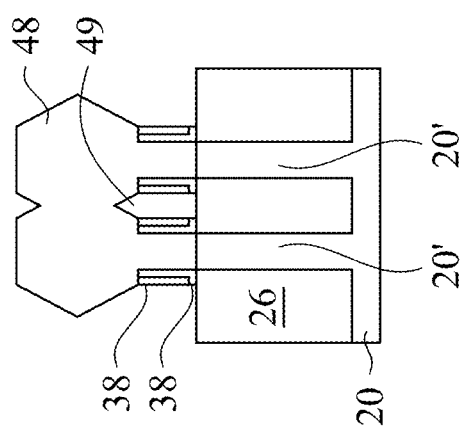

Referring to FIGS. 9A and 9B, epitaxial source/drain regions 48 are formed in recesses 42. The respective process is illustrated as process 216 in the process flow 200 shown in FIG. 24. In accordance with some embodiments, the source/drain regions 48 may exert stress on the nanostructures 22B, which are used as the channels of the corresponding GAA transistors, thereby improving performance. In accordance with some embodiments, the corresponding transistor is n-type, and epitaxial source/drain regions 48 are accordingly formed as of n-type by doping an n-type dopant. For example, silicon phosphorous (SiP), silicon carbon phosphorous (SiCP), or the like may be grown to form epitaxial source/drain regions 48. After recesses 42 are filled with epitaxy regions 48, the further epitaxial growth of epitaxy regions 48 causes epitaxy regions 48 to expand horizontally, and facets may be formed. The further growth of epitaxy regions 48 may also cause neighboring epitaxy regions 48 to merge with each other, hence forming void 49 therein.

After the epitaxy process, epitaxy regions 48 may be further implanted with an n-type impurity to form source and drain regions, which are also denoted using reference numeral 48. In accordance with alternative embodiments of the present disclosure, the implantation process is skipped when epitaxy regions 48 are in-situ doped with the n-type impurity during the epitaxy, and the epitaxy regions 48 are also source/drain regions.

The subsequent figure numbers in FIGS. 10A, 10B, and 10C through FIGS. 19A, 19B, and 19C may have the corresponding numbers followed by letter A, B, or C. Unless specified otherwise, the letter A indicates that the corresponding figure shows a cross-section same as the cross-section A2-A2 in FIG. 4, the letter B indicates that the corresponding figure shows a reference cross-section same as the reference cross-section B-B in FIG. 4, and letter C indicates the corresponding figure (except FIGS. 12C, 13C, 14C, and 17C) shows a cross-section same as the cross-section A1-A1 in FIG. 4.

Figure 10B:
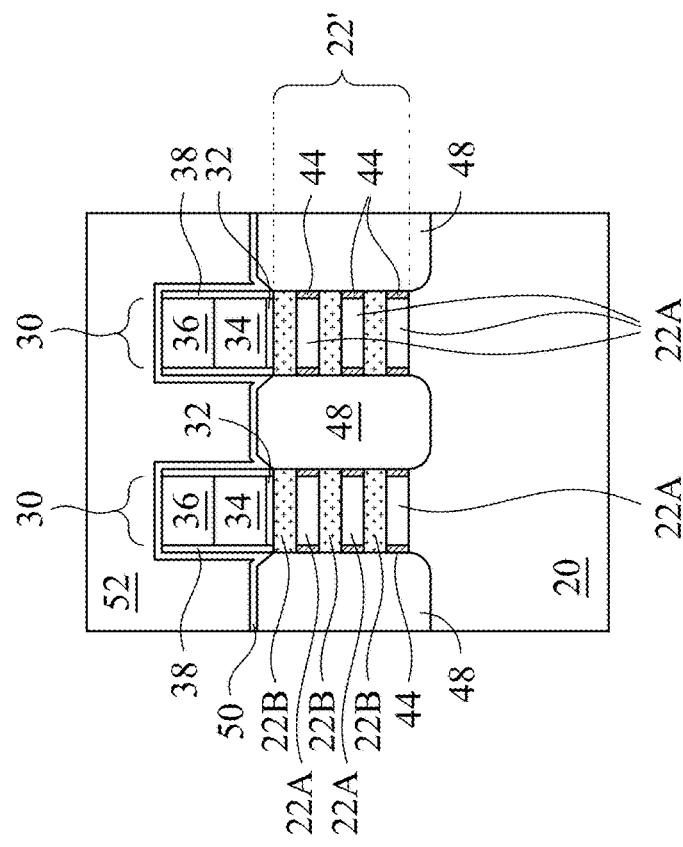
Figure 10A:
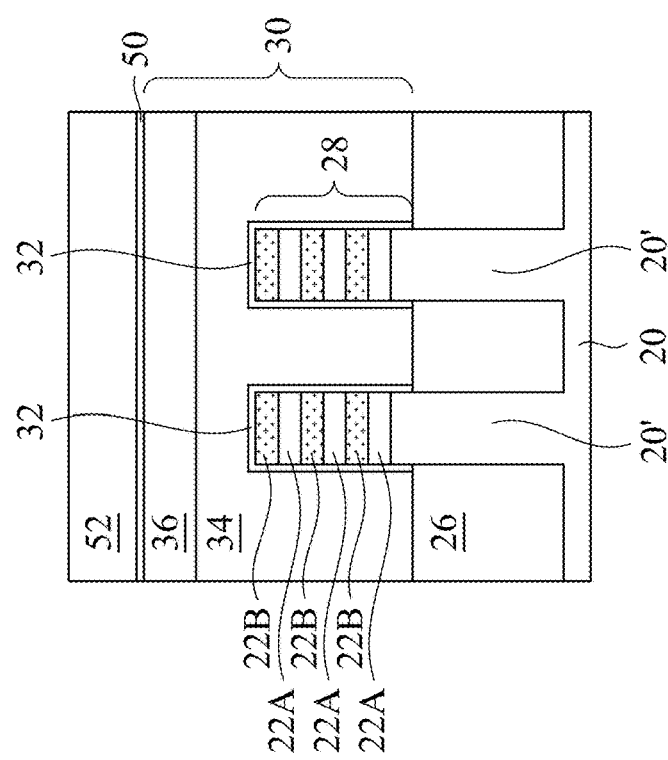
Figure 10C:
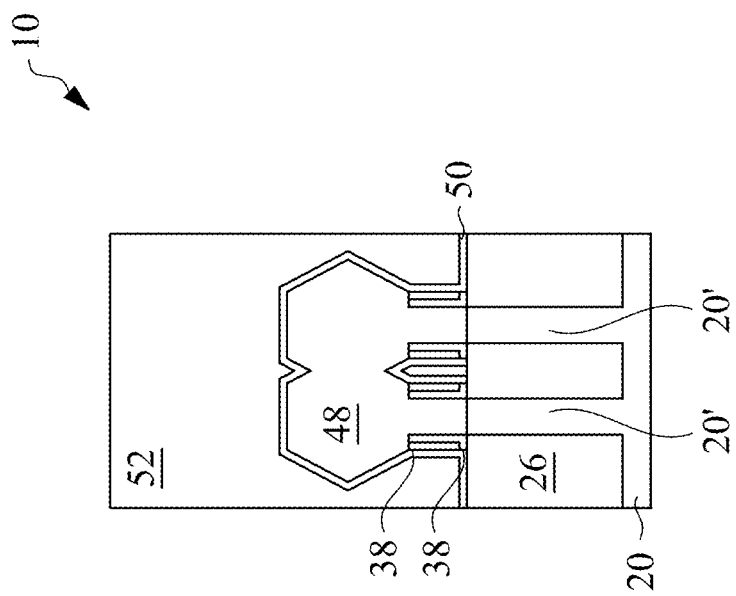

FIGS. 10A, 10B, and 10C illustrate the cross-sectional views of the structure after the formation of Contact Etch Stop Layer (CESL) 50 and Inter-Layer Dielectric (ILD) 52. The respective process is illustrated as process 218 in the process flow 200 shown in FIG. 24. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), Undoped Silicate Glass (USG), or the like.

Figure 11B:
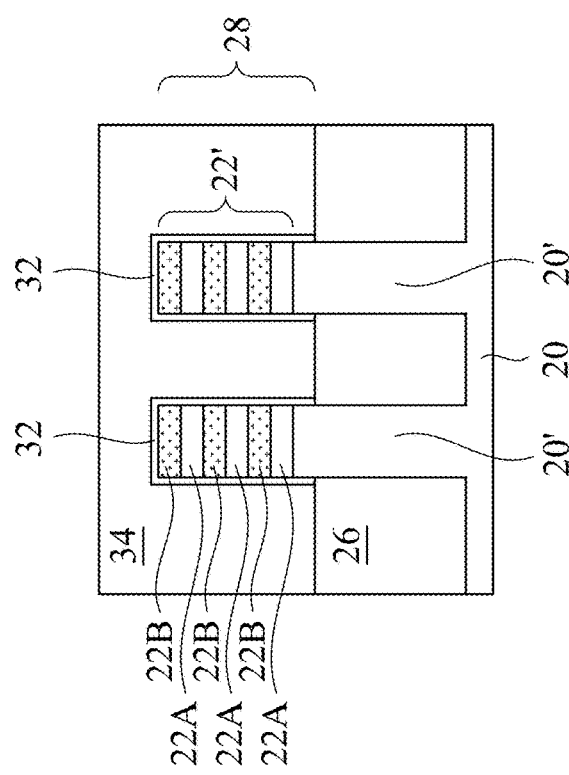
Figure 11A:
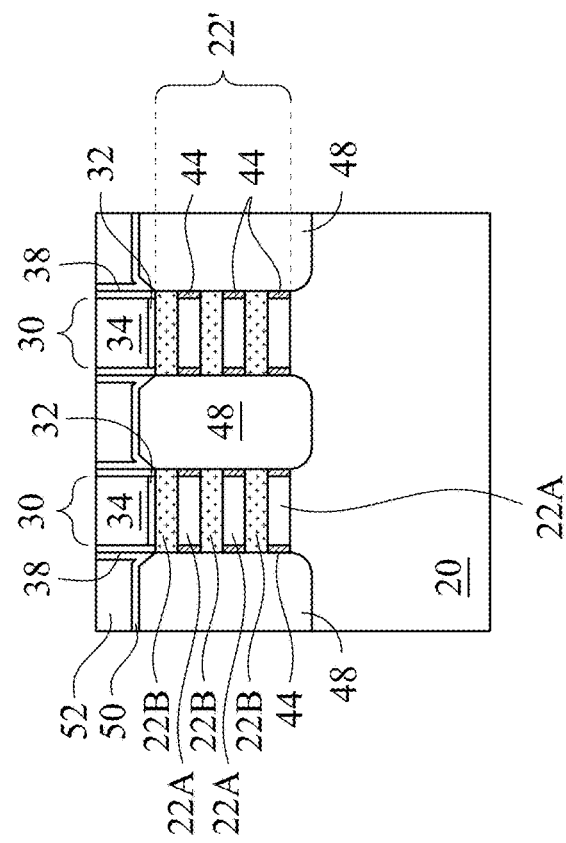

FIGS. 11A and 11B through FIGS. 17A, 17B, 17C, 17D, and 17E illustrate the processes for forming replacement gate stacks. In FIGS. 11A and 11B, a planarization process such as a CMP process or a mechanical grinding process is performed to level the top surface of ILD 52. The respective process is illustrated as process 220 in the process flow 200 shown in FIG. 24. In accordance with some embodiments, the planarization process may remove hard masks 36 to reveal dummy gate electrodes 34, as shown in FIG. 11B. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level with each other within process variations.

Figure 12B:
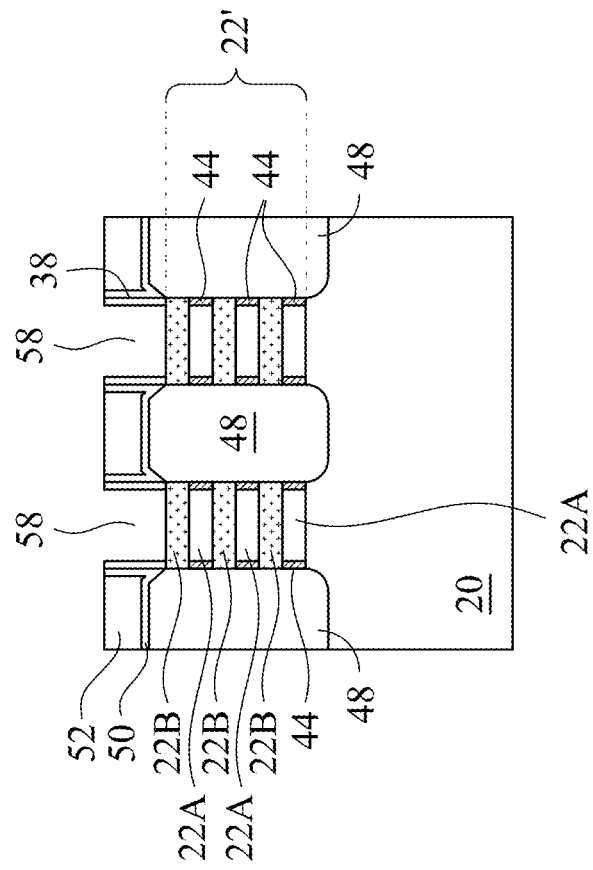
Figure 12A:
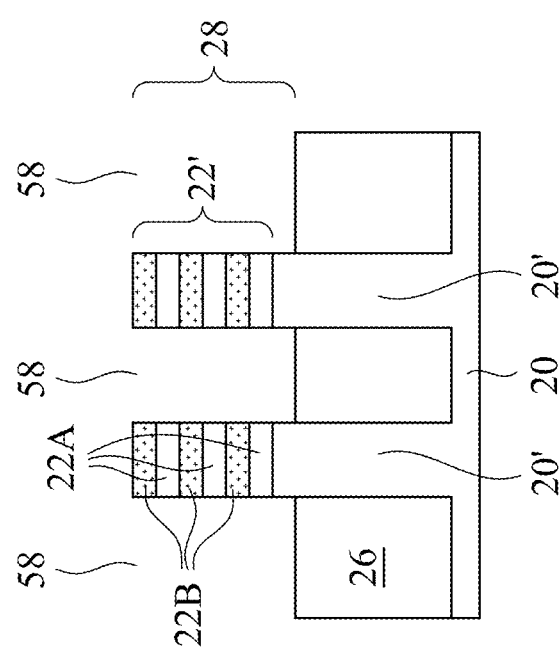
Figure 12C:
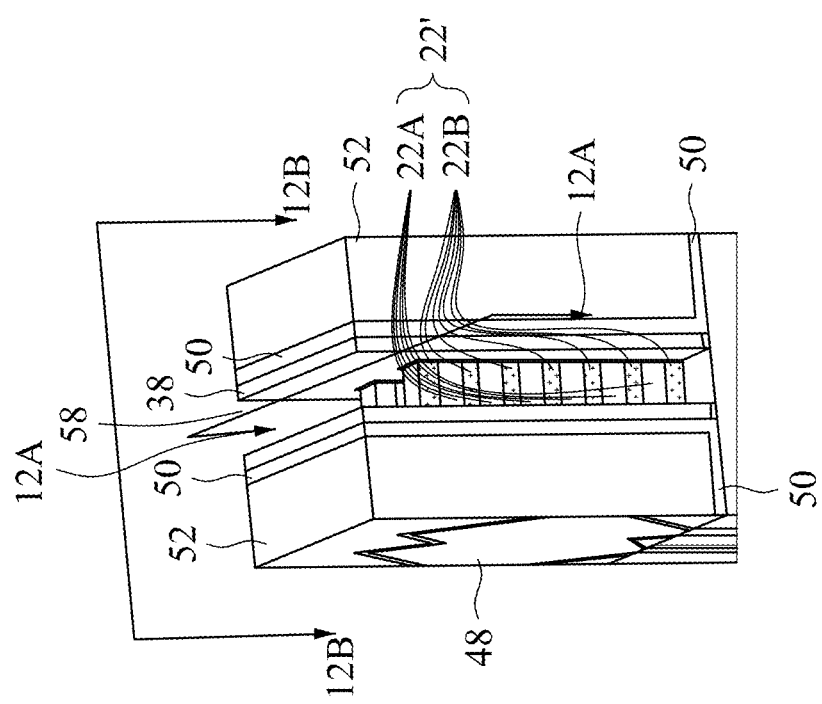

Next, dummy gate electrodes 34 (and hard masks 36, if remaining) are removed in one or more etching processes, so that recesses 58 are formed, as shown in FIGS. 12A, 12B and 12C. The respective process is illustrated as process 222 in the process flow 200 shown in FIG. 24. FIG. 12C illustrates a perspective view of the structure, and FIGS. 12A and 12B illustrate the cross-sectional views 12A-12A and 12B-12B, respectively, in FIG. 12C. The portions of the dummy gate dielectrics 32 in recesses 58 are also removed. In accordance with some embodiments, dummy gate electrodes 34 and dummy gate dielectrics 32 are removed through dry etching processes. For example, the etching process may be performed using reaction gas(es) that selectively etch dummy gate electrodes 34 at a faster rate than ILD 52. Each recess 58 exposes and/or overlies portions of multilayer stacks 22', which include the future channel regions in subsequently completed nano-FETs. The corresponding portions of the multilayer stacks 22' are between neighboring pairs of the epitaxial source/drain regions 48.

Figure 13B:
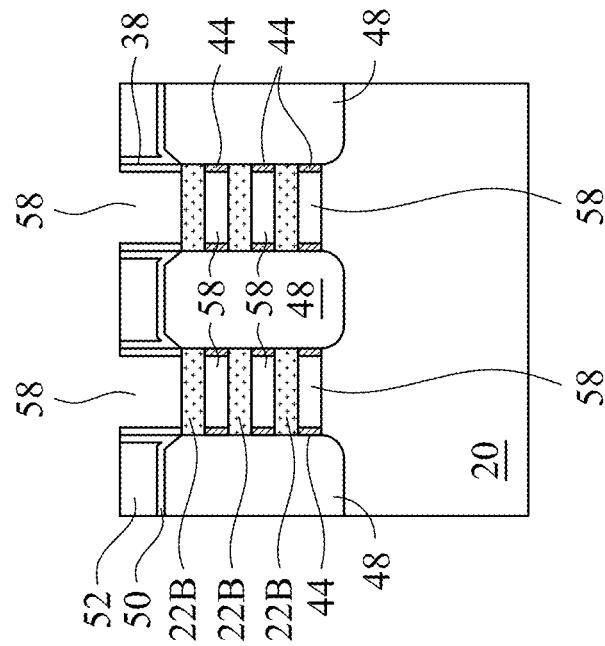
Figure 13A:
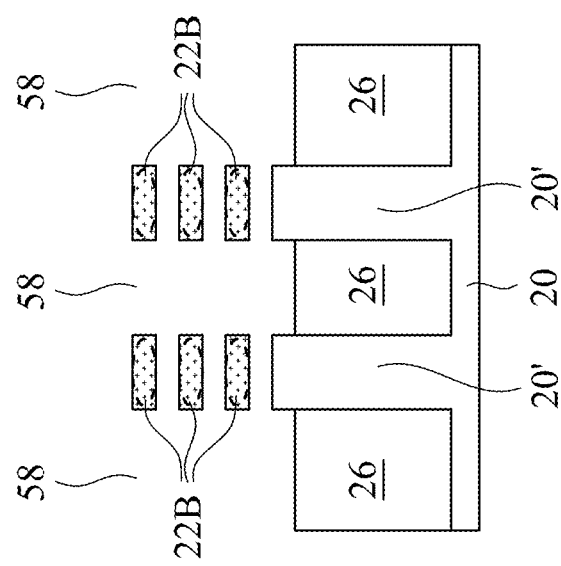
Figure 13C:
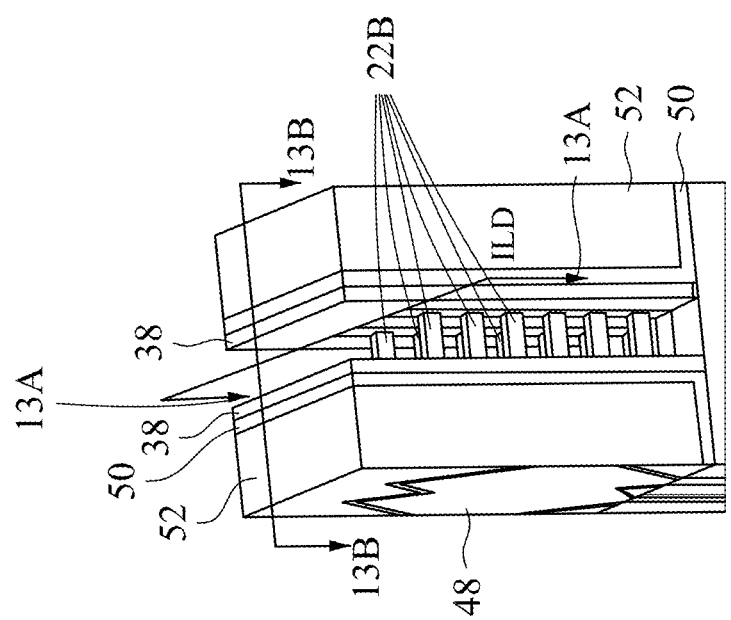

Sacrificial layers 22A are then removed to extend recesses 58 between nanostructures 22B, and the resulting structure is shown in FIGS. 13A, 13B, and 13C. The respective process is illustrated as process 224 in the process flow 200 shown in FIG. 24. FIG. 13C illustrates a perspective view of the structure, and FIGS. 13A and 13B illustrate the cross-sectional views 13A-13A and 13B-13B, respectively, in FIG. 13C. Sacrificial layers 22A may be removed by performing an isotropic etching process such as a wet etching process using etchants which are selective to the materials of sacrificial layers 22A. Nanostructures 22B, substrate 20, STI regions 26 remain relatively un-etched as compared to sacrificial layers 22A. In accordance with some embodiments in which sacrificial layers 22A include, for example, SiGe, and nanostructures 22B include, for example, Si or SiC, tetra methyl ammonium hydroxide (TMAH), ammonium hydroxide ($NH_4OH$), or the like may be used to remove sacrificial layers 22A. It is appreciated that although FIG. 13A and subsequent figures illustrate the cross-sections of nanostructures 22B as being rectangular, nanostructures 22B may have rounded corners, as illustrated by dashed lines in FIG. 13A.

Figure 14B:
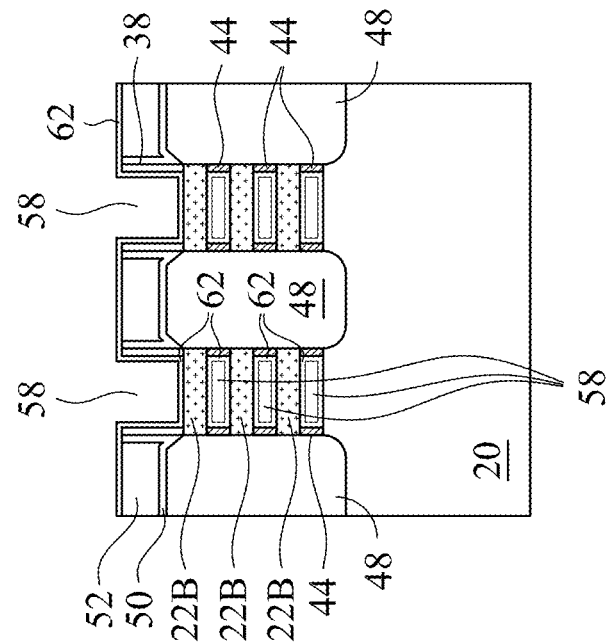
Figure 14C:
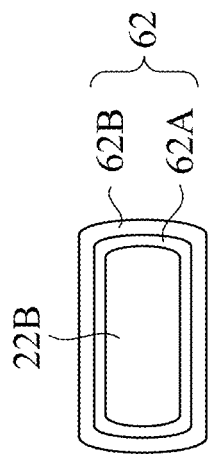
Figure 14A:
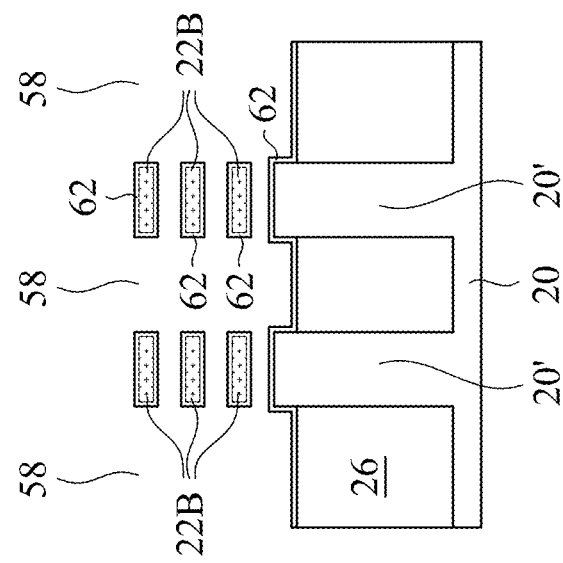

Referring to FIGS. 14A and 14B, and FIG. 14C, gate dielectrics 62 are formed. The respective process is illustrated as process 226 in the process flow 200 shown in FIG. 24. The details of an example gate dielectric 62 are shown in FIG. 14C. In accordance with some embodiments, each of gate dielectrics 62 includes interfacial layer 62A and high-k dielectric layer 62B on the interfacial layer 62A. The interfacial layer 62A may be formed of or comprises silicon oxide, which may be deposited through a conformal deposition process such as ALD or CVD. In accordance with some embodiments, the high-k dielectric layers 62B comprise one or more dielectric layers. For example, the high-k dielectric layer(s) 62B may include a metal oxide or a silicate of hafnium, aluminum, zirconium, lanthanum, manganese, barium, titanium, lead, or combinations thereof.

Figure 15B:
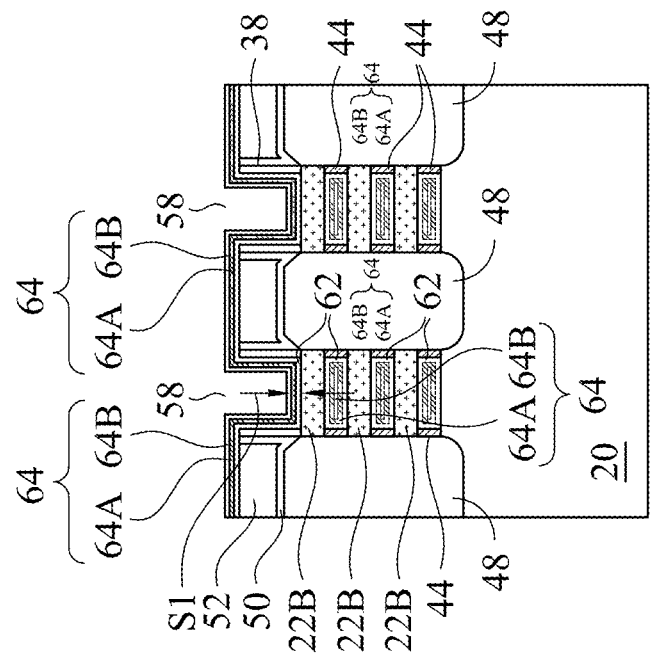
Figure 15A:
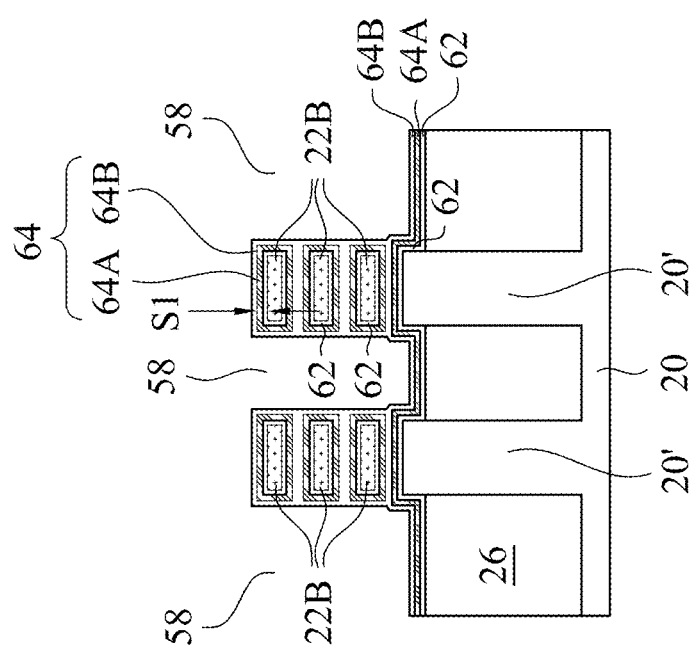

Referring to FIGS. 15A and 15B, work-function layer 64, which includes metal-containing layer 64A and silicon layer 64B, is deposited. Metal-containing layer 64A is deposited first. The respective process is illustrated as process 228 in the process flow 200 shown in FIG. 24. Metal-containing layer 64A may include a metal-containing material such as TiN, TaN, WN, WCN, TiCN, combinations thereof, and/or multilayers thereof. Furthermore, metal-containing layer 64A is free from aluminum. Metal-containing layer 64A may by itself (and as deposited without further processing) have a p-type work function that is higher than a mid-gap work-function of silicon. The mid-gap work-function may be equal to about 4.55 eV, which is in the middle between the conduction band of Si (~4.1 eV) and Si valence band (~5 eV). The formation process may include depositing a plurality of atomic layers, each may be a TiN layer, a TaN layer, a WCN layer, or the like using ALD. Other conformal deposition processes such as CVD may also be used. As shown in FIG. 15A, metal-containing layer 64A encircles nanostructures 22B. After the formation of work-function layer 64, there are still gaps 58 left between the metal-containing layers 64A that are formed on neighboring nanostructures 22B.

When metal-containing layer 64A comprises TiN, the deposition is performed using a titanium-containing precursor and a nitrogen-containing precursor. The titanium-containing precursor may include $TiCl_4$, $TiCl_5$, or the like, or combinations thereof. The nitrogen-containing precursor may include $NH_3$. A plurality of ALD cycles are performed, each may include pulsing and purging the titanium-containing precursor, and pulsing and purging the nitrogen-containing precursor. In accordance with some embodiments, metal-containing layer 64A has a thickness in the range between about 8 Å and about 20 Å.

In accordance with some embodiments, in which the deposition of TiN for metal-containing layer 64A is performed using $TiCl_4$ and $NH_3$ as process gases, and ALD is used, the temperature of wafer 10 may be in the range between about 270° C. and about 550° C. The chamber pressure may be in the range between about 0.5 Torr and about 50 Torr.

When metal-containing layer 64A comprises TaN, the deposition is performed using a tantalum-containing precursor and a nitrogen-containing precursor. The tantalum-containing precursor may include $TaCl_4$, $TaCl_5$, or the like, or combinations thereof. The nitrogen-containing precursor may include $NH_3$. A plurality of ALD cycles are performed, each may include pulsing and purging the tantalum-containing precursor, and pulsing and purging the nitrogen-containing precursor.

When metal-containing layer 64A comprises WCN, the deposition is performed using a tungsten-containing precursor and a nitrogen-containing precursor. The tungsten-containing precursor may include $C_{12}H_{30}N_4W$. The nitrogen-containing precursor may include $NH_3$. A plurality of ALD cycles are performed, each may include pulsing and purging the $C_{12}H_{30}N_4W$, and pulsing and purging the nitrogen-containing precursor.

Metal-containing layer 64A may also be a multi-layer including the combination of the above-discussed layers. For example, metal-containing layer 64A may include TiN layers and TaN layers over the TiN layers. Other combinations are also in the scope of the present disclosure.

After the deposition of metal-containing layer 64A, silicon layer 64B is deposited. The respective process is illustrated as process 230 in the process flow 200 shown in FIG. 24. In accordance with some embodiments, silicon layer 64B includes elemental silicon, which is not in the form of a chemical compound. The formation of silicon layer 64B may be performed through a soaking process using a silicon-containing precursor. The silicon-containing precursor may include silane ($SiH_4$), disilane ($Si_2H_6$), trisilane ($Si_3H_8$), or the like, or combinations thereof. In accordance with some embodiments, the soaking temperature of the wafer may be in the range between about 325° C. and about 600° C. Some carrier gases such as argon may be used. The silicon-containing precursor may be free from the compound gases that include Ti, N, Al, and the like. The chamber pressure may be in the range between about 0.5 Torr and about 40 Torr. The soaking time may be long enough so that in the cross-sectional view as shown in FIG. 15B, silicon layer 64B fully fills the gaps between neighboring nanostructures 22B. For example, the soaking time may be in the range between about 10 seconds and about 10 minutes. In the resulting GAA transistor, both of metal-containing layer 64A and silicon layer 64B are within the distance that is able to affect the work function of the resulting transistor. Metal-containing layer 64A and silicon layer 64B thus collectively act as the work-function layer of the resulting gate stack, and are collectively referred to as work-function layer 64. For example, the distance 51 (marked in FIGS. 15A and 15B) between silicon layer 64B and the nearest nanostructures 22B may be smaller than about 4 nm or smaller than about 3 nm.

FIGS. 15A and 15B illustrate that work-function layer 64 include one metal-containing layer and one silicon layer in accordance with some embodiments. In accordance with alternative embodiments, work-function layer 64 includes a plurality of composite layers, with each of the composite layers including one metal-containing layer and one silicon layer over the metal-containing layer. Accordingly, the metal-containing layers and silicon layers are formed alternatingly. The formation process may be realized from the above discussion.

The formation of silicon layer 64B has the effect of reducing the work-function of the resulting gate electrode, so that the work function falls into the desirable range for n-type transistors, which is equal to or lower than the mid-gap work function of about 4.55 eV (when nanostructures 22B are formed of silicon). The reduction of the work function may be caused by the doping of silicon into the metal-containing layer 64A. The reduction in the work-function may also be due to the generation of vacancies in the high-k dielectric layer 62B (FIG. 14C) due to the diffusion of silicon into high-k dielectric layer 62B.

Figure 16B:
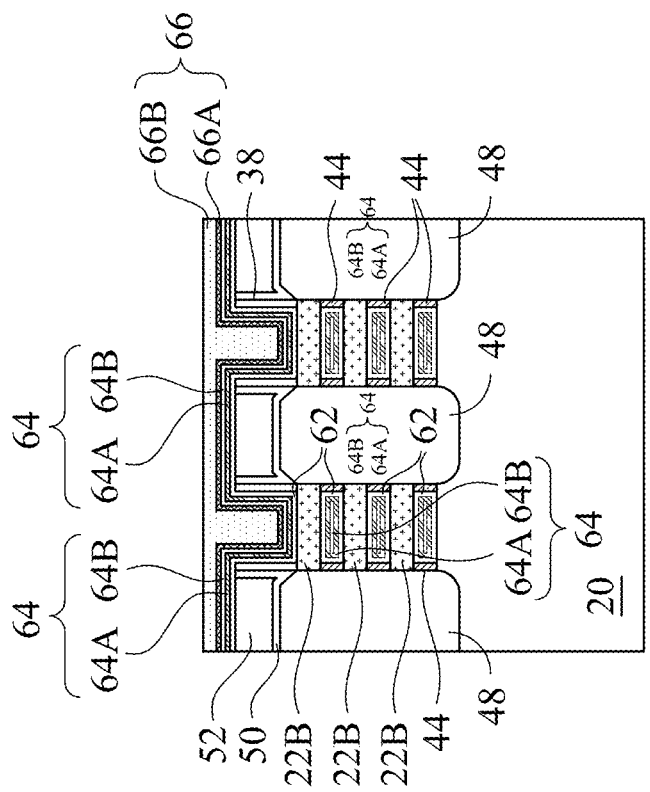
Figure 16A:
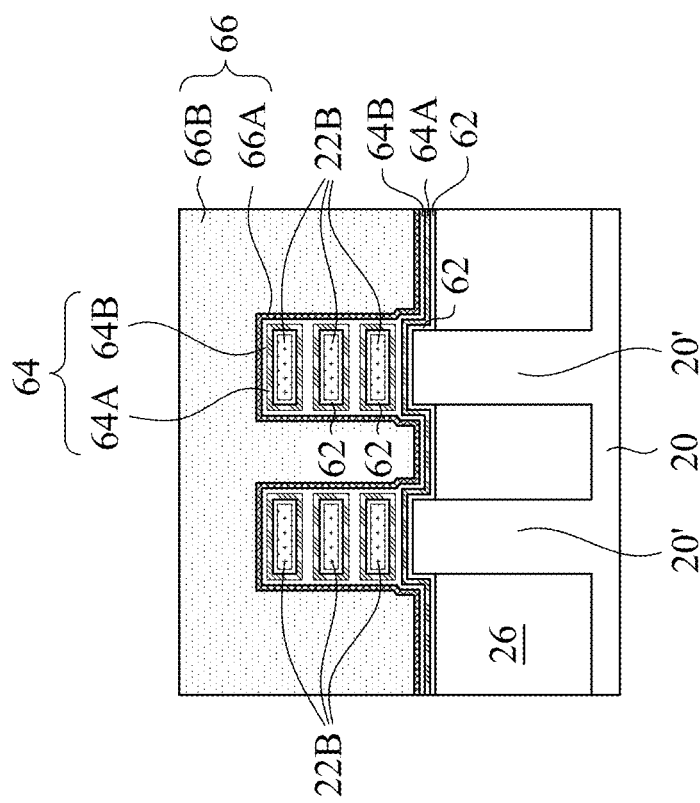

FIGS. 16A and 16B illustrate the deposition of filling-layers 66 to fully fill the remaining recesses 58. The deposition may include CVD, ALD, etc. In accordance with some embodiments, filling layers 66 includes glue layer 66A, and filling material 66B over glue layer 66A. Glue layer 66A may be formed of or comprises TiN, TaN, WN, WCN, TiCN, or the like, or combinations thereof. In accordance with some embodiments, in which glue layer 66A comprises TiN, and the deposition is performed using $TiCl_4$ and $NH_3$ as process gases, ALD is used, and the temperature of wafer 10 may be in the range between about 270° C. and about 550° C. The chamber pressure may be in the range between about 0.5 Torr and about 50 Torr. Filling-material 66B may be formed of or comprise tungsten, cobalt, aluminum, or the like, or alloys thereof.

Figure 22:
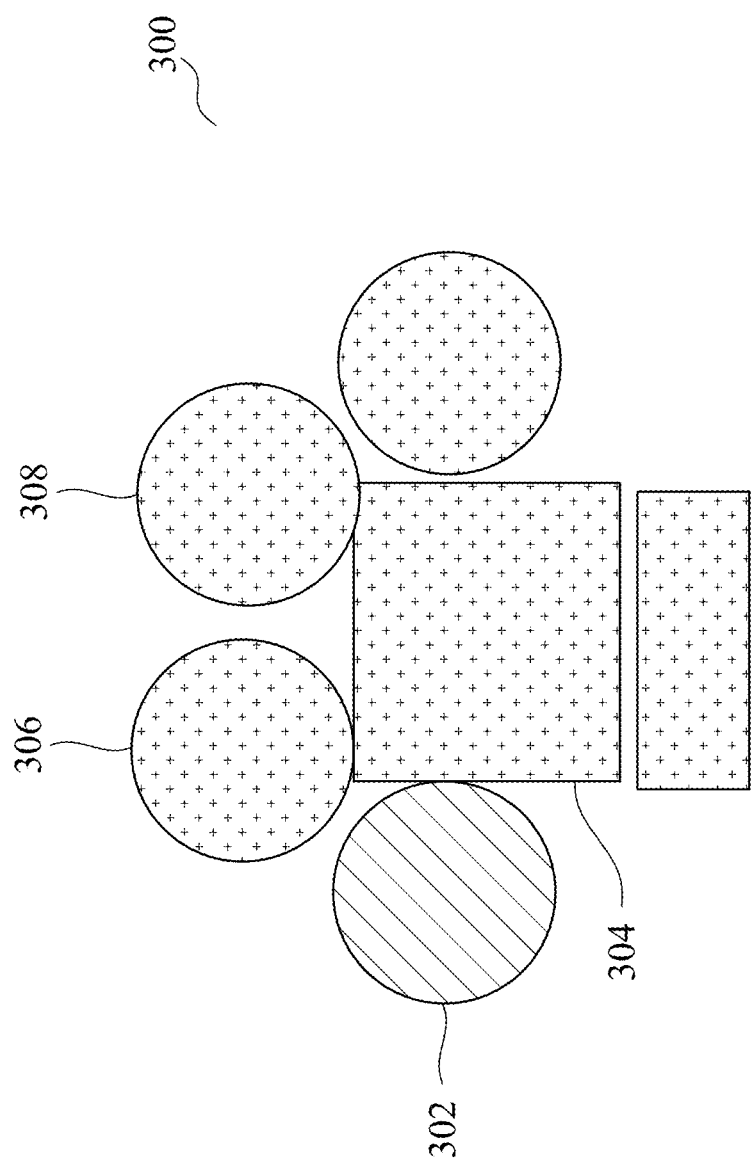
FIG. 22 illustrates a production tool for performing in-situ deposition processes of a plurality of layers in accordance with some embodiments.

In accordance with some embodiments, the processes as shown in FIGS. 15A, 15B, 16A, and 16B are in-situ performed in a same vacuum environment. For example, FIG. 22 schematically illustrates production tool 300, in which the deposition of metal-containing layer 64A and silicon layer 64B (as shown in FIGS. 15A and 15B), and the deposition of glue layer 66A are performed. Production tool 300 includes deposition chamber 302 for depositing metal-containing layer(s) 64A, transferring chamber 304 for transferring wafer 10 between different deposition chambers, and deposition chamber 306 for depositing silicon layer(s) 64B. Glue layer 66A may also be deposited in deposition chamber 302 when metal-containing layer 64A and glue layer 66A are formed of the same material such as TiN, or deposited in a different deposition chamber such as in deposition chamber 308.

The deposition of metal-containing layer 64A, silicon layer 64B and glue layer 66A are in-situ performed, without vacuum break in between. This is different from conventional ex-situ deposition if there is any TiN deposited on silicon layer. In the conventional ex-situ deposition processes, a vacuum break occurs between the deposition of silicon and the deposition of TiN, which will result in the oxidation of silicon layer 64B. In accordance with some embodiments of the present disclosure, nitridation will occur on the silicon layer, for example, when silicon layer 64B is exposed to the nitrogen-containing process gas that is used for depositing glue layer 66A. It has been found that by using the in-situ deposition, the gate resistance is reduced by about 40 percent.

Figure 23:
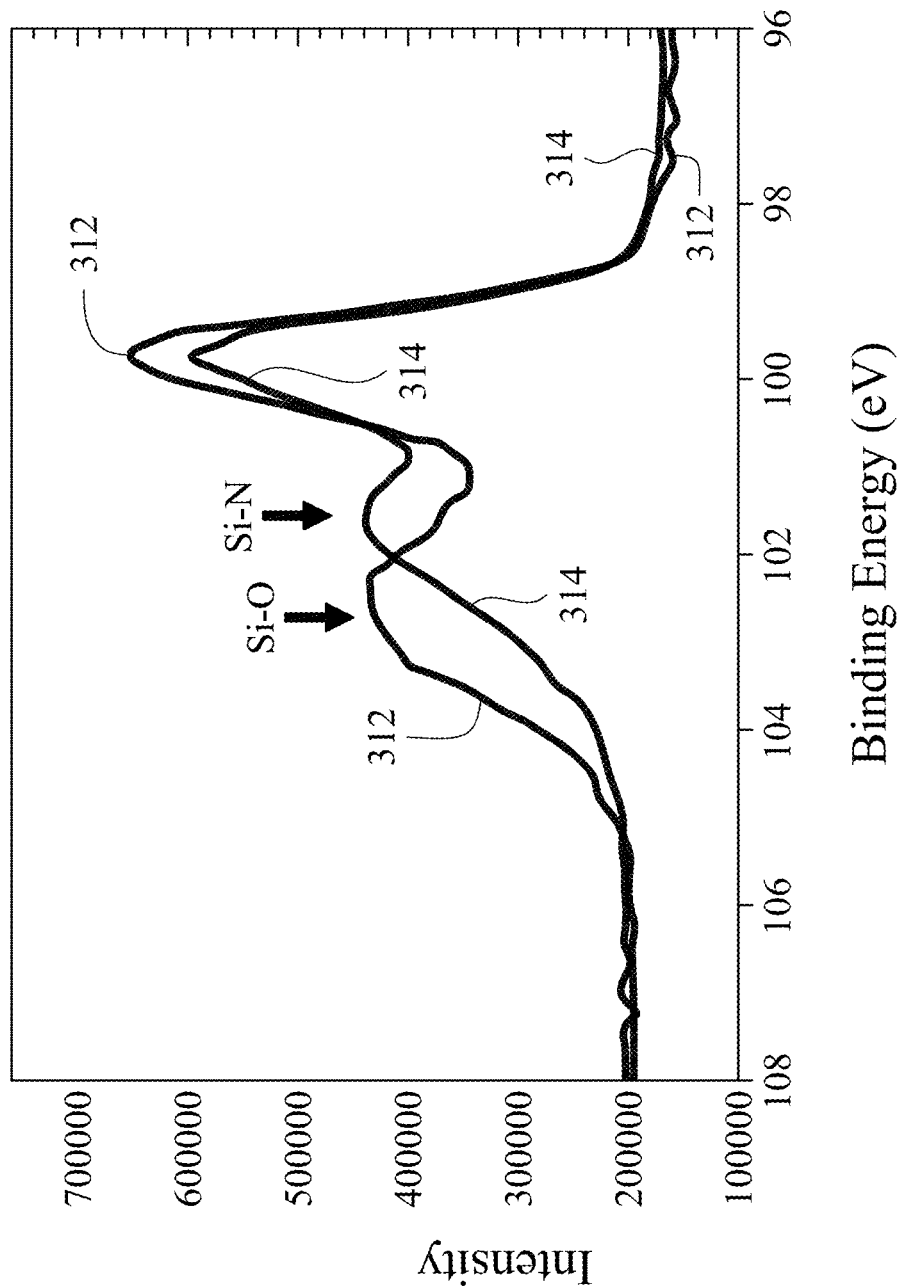
FIG. 23 illustrates the X-Ray Photoelectron Spectroscopy (XPS Spectroscopy) results of an ex-situ deposited sample and an in-situ deposited sample in accordance with some embodiments.

FIG. 23 illustrates the X-Ray Photoelectron Spectroscopy (XPS Spectroscopy) results of two samples, wherein the signal intensity values are shown as the functions of binding energy. Line 312 illustrates the result of the ex-situ deposition of a TiN layer, a silicon layer, and another TiN layer, wherein vacuum break occurs between the deposition of the silicon layer and the SiN layer. Line 314 illustrates the result of the in-situ deposition of a TiN layer, a silicon layer, and another TiN layer, wherein no vacuum break occurs in between. Line 312 includes a Si—O peak, with no Si—N peak occurring. This proves that in the ex-situ deposition processes, silicon layer 64B has been oxidized. Line 314 includes a Si—N peak, with no Si—O peak occurring. This proves that in the in-situ deposition processes, silicon layer 64B has been nitrided, and is not oxidized. Accordingly, silicon layer 64B is free from oxygen therein.

Figure 17B:
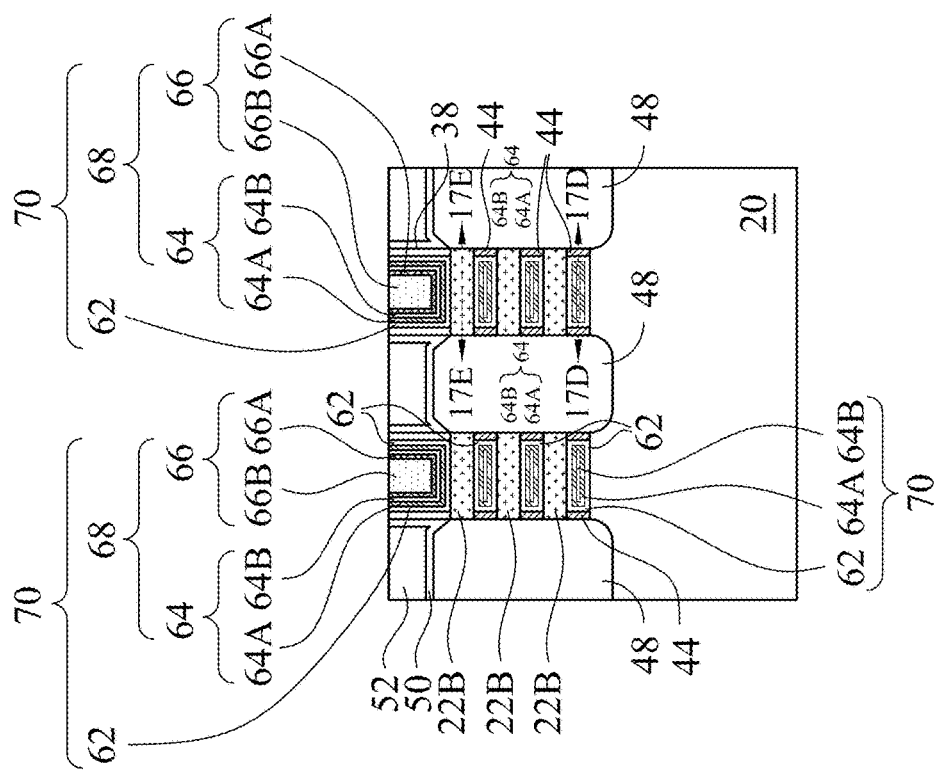
Figure 17A:
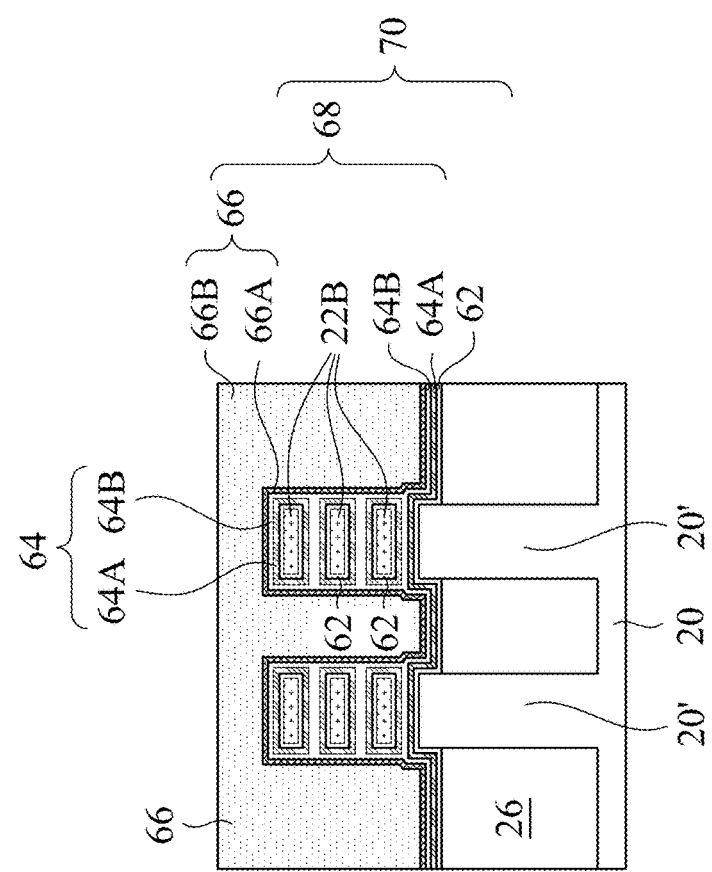

After the deposition of filling-layers 66, a planarization process such as a CMP process or a mechanical grinding process is performed to remove the excess portions of the gate dielectrics 62, work-function layer 64, and filling-layers 66, which excess portions are over the top surface of ILD 52. The respective process is illustrated as process 232 in the process flow 200 shown in FIG. 24. The resulting structure is shown in FIGS. 17A and 17B. The remaining filling-layers 66 and work-function layer 64 are collectively referred to as gate electrodes 68. Gate electrodes 68 and gate dielectrics 62 are collectively referred to as gate stacks 70 of the resulting nano-FETs.

Gate stacks 70 are substantially free from aluminum, unlike conventional gate stacks of n-type transistors. For example, the aluminum atomic percentage in the gate stacks of the present disclosure is lower than about 1.5 percent, or may be zero, while in conventional gate stacks of n-type transistors, the aluminum atomic percentage of a work-function layer is higher than 1.5 percent.

Figure 17D:
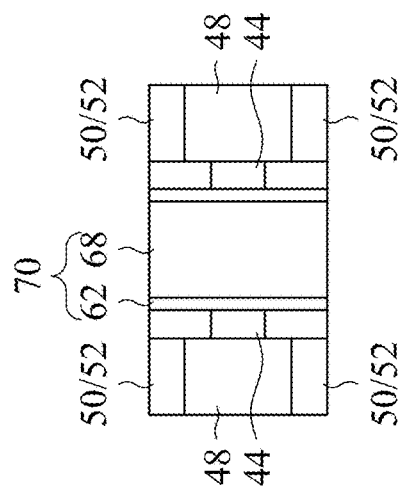
Figure 17E:
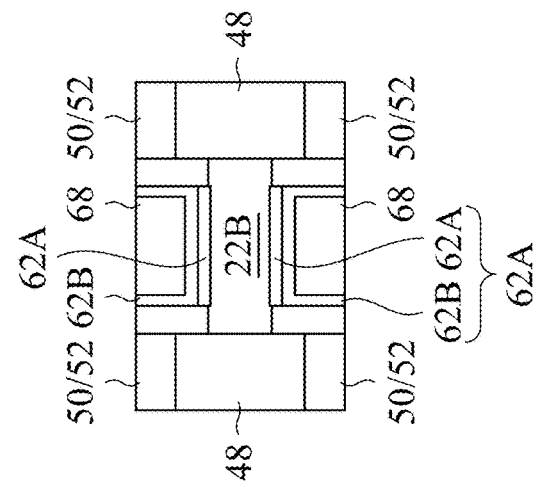
Figure 17C:
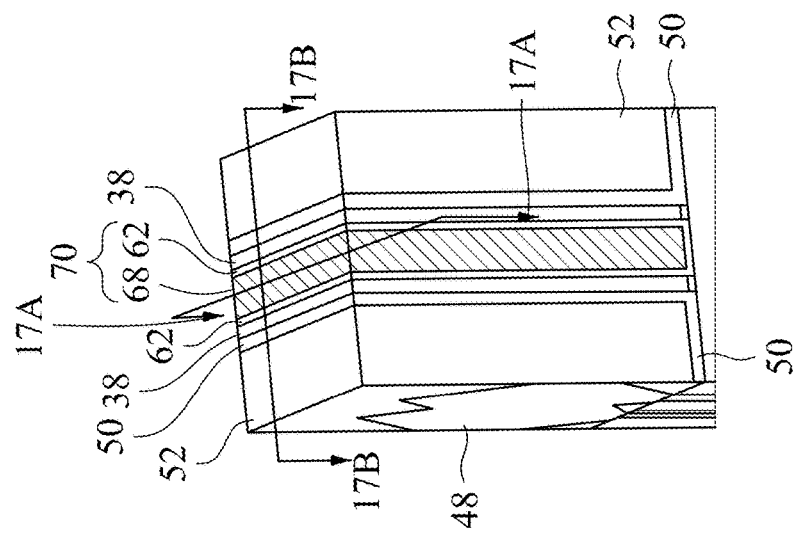

FIG. 17C illustrates a perspective view of the structure shown in FIGS. 17A and 17B, wherein the cross-sectional views shown in FIGS. 17A and 17B are obtained from the cross-sections 17A-17A and 17B-17B, respectively, in FIG. 17B. FIGS. 17D and 17E illustrate the horizontal cross-sectional views of the structure shown in FIGS. 17A, 17B, and 17C, wherein the horizontal cross-sectional views are obtained from the horizontal planes 17D-17D and 17E-17E, respectively, in FIG. 17B.

Figure 18B:
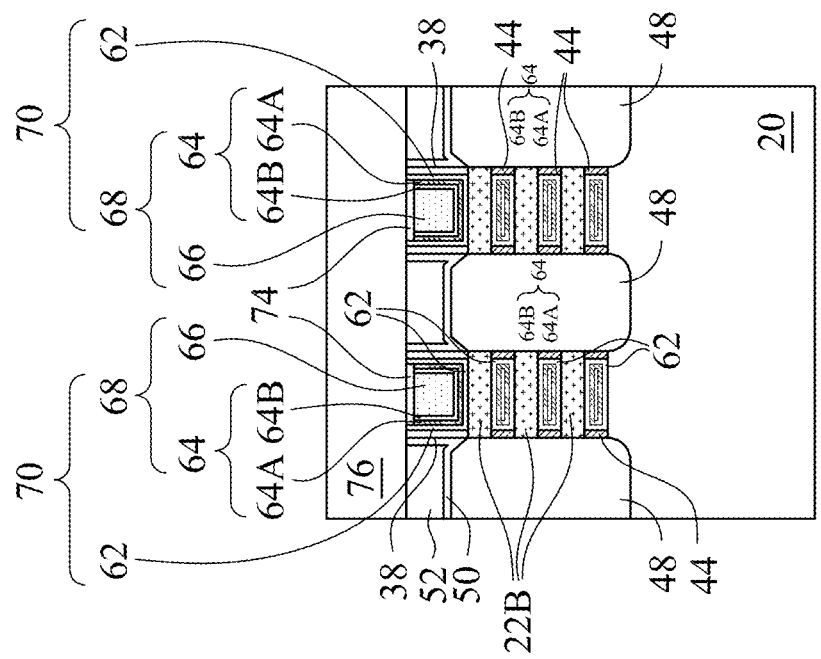
Figure 18A:
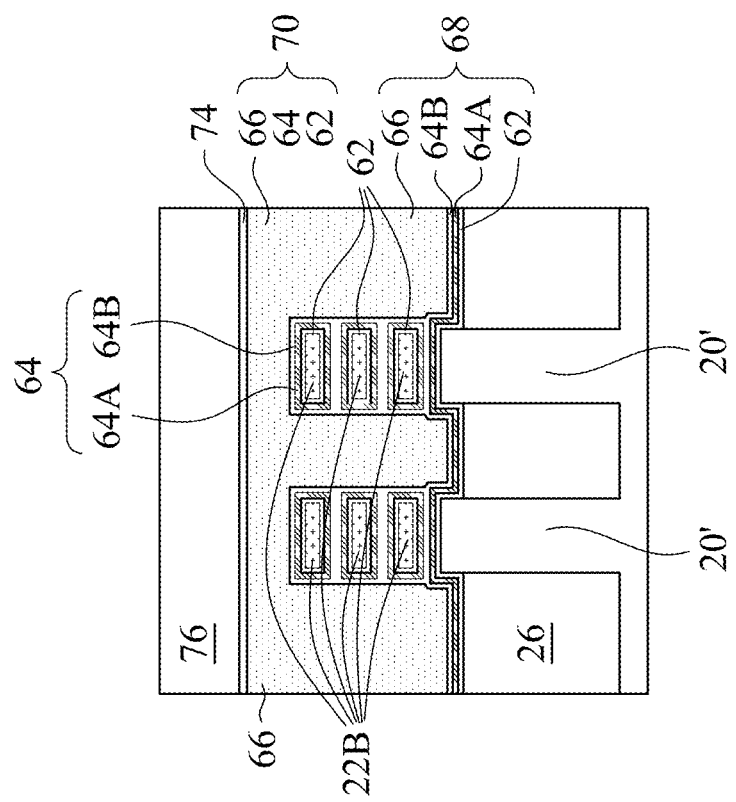
Figure 18C:
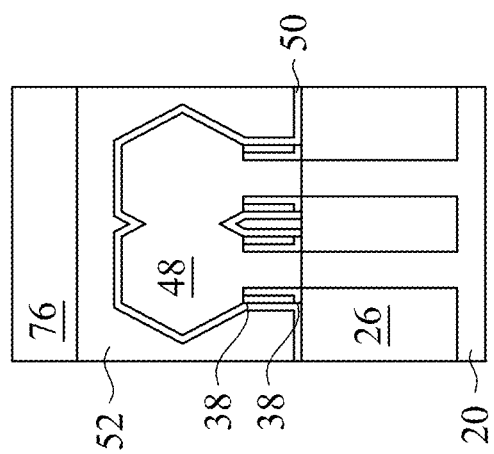

In the processes shown in FIGS. 18A, 18B, and 18C, gate stacks 70 (including gate dielectrics 62 and the corresponding overlying gate electrodes 68) are recessed, so that recesses are formed directly over gate stacks 70 and between opposing portions of gate spacers 38. A gate mask 74 comprising one or more layers of dielectric material, such as silicon nitride, silicon oxynitride, or the like, is filled in each of the recesses, followed by a planarization process to remove excess portions of the dielectric material extending over ILD 52. The respective process is illustrated as process 234 in the process flow 200 shown in FIG. 24. Subsequently formed gate contacts (such as the gate contact plugs 80, discussed below with respect to FIGS. 19A and 19B) penetrate through the gate mask 74 to contact the top surface of the recessed gate electrodes 68.

As further illustrated by FIGS. 18A, 18B, and 18C, ILD 76 is deposited over ILD 52 and over gate masks 74. The respective process is illustrated as process 236 in the process flow 200 shown in FIG. 24. An etch stop layer (not shown), may be, or may not be deposited before the formation of ILD 76. In accordance with some embodiments, ILD 76 is formed through FCVD, CVD, PECVD, or the like. ILD 76 is formed of a dielectric material, which may be selected from silicon oxide, PSG, BSG, BPSG, USG, or the like.

Figures 19A, 19B:
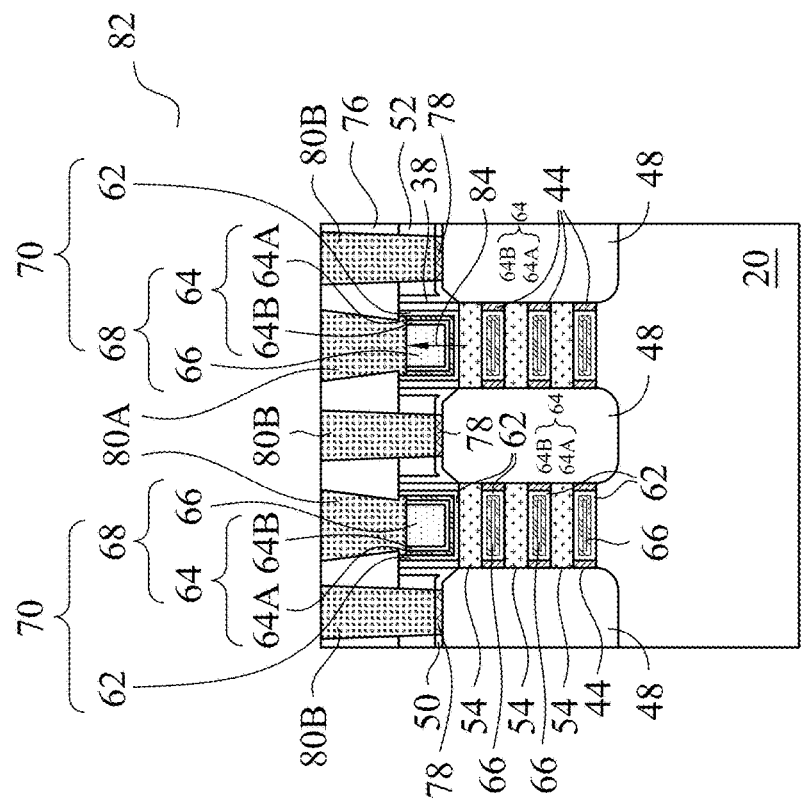
Figure 19C:
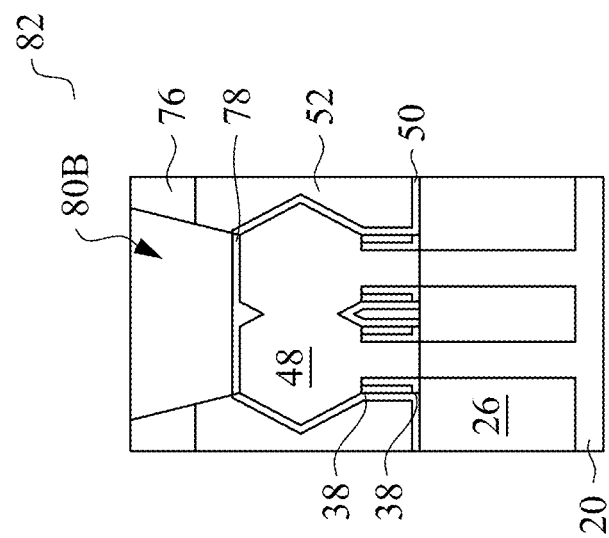

In FIGS. 19A, 19B, and 19C, ILD 76, ILD 52, CESL 50, and gate masks 74 are etched to form recesses (occupied by contact plugs 80A and 80B) exposing surfaces of the epitaxial source/drain regions 48 and/or gate stacks 70. The recesses may be formed through etching using an anisotropic etching process, such as RIE, NBE, or the like. In accordance with some embodiments, the recesses may be formed by etching-through ILD 76 and ILD 52 using a first etching process, etching-through gate masks 74 using a second etching process, and etching-through CESL 50 possibly using a third etching process. Although FIG. 19B illustrates that contact plugs 80A and 80B are in a same cross-section, in various embodiments, contact plugs 80A and 80B may be formed in different cross-sections, thereby reducing the risk of shorting with each other.

After the recesses are formed, silicide regions 78 (FIGS. 19B and 19C) are formed over the epitaxial source/drain regions 48. The respective process is illustrated as process 238 in the process flow 200 shown in FIG. 24. In accordance with some embodiments, silicide regions 78 are formed by first depositing a metal layer (not shown) capable of reacting with the semiconductor materials of the underlying epitaxial source/drain regions 48 (for example, silicon, silicon germanium, germanium) to form silicide and/or germanide regions, then performing a thermal anneal process to form silicide regions 78. The metal may include nickel, cobalt, titanium, tantalum, platinum, tungsten, or the like. The un-reacted portions of the deposited metal are then removed, for example, by an etching process.

Contact plugs 80B are then formed over silicide regions 78. Also, contact plugs 80A (may also be referred to as gate contact plugs) are also formed in the recesses, and are over and contacting gate electrodes 68. The respective processes are illustrated as process 240 in the process flow 200 shown in FIG. 24. Contact plugs 80A and 80B may each comprise one or more layers, such as a barrier layer, a diffusion layer, and a fill material. For example, in accordance with some embodiments, contact plugs 80A and 80B each includes a barrier layer and a conductive material, and are electrically coupled to the underlying conductive feature (for example, gate stacks 70 and/or silicide region 78 in the illustrated embodiment). The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP process, may be performed to remove excess material from a surface of ILD 76. Nano-FET 82 is thus formed.

Figure 20:
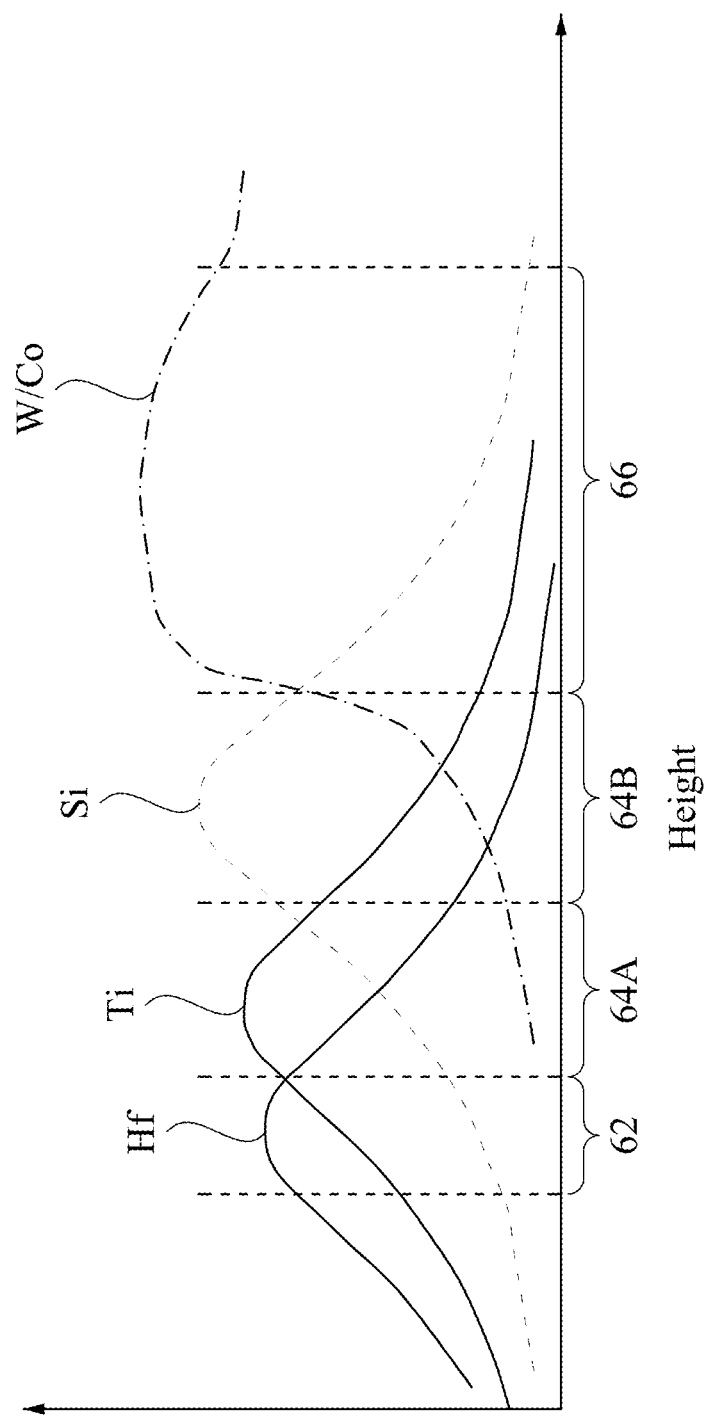
FIGS. 20 and 21 illustrate the distribution of the atomic percentages of several elements in gate stacks in accordance with some embodiments.

FIG. 20 illustrates the silicon atomic percentage, titanium atomic percentage (in metal-containing layer 64A), and hafnium atomic percentage (in high-k dielectric layer 62) in gate stacks 70 (FIG. 19B) as functions of height from nanostructure 22B. The tungsten or cobalt in filling-layers 66 is also illustrated as an example. FIG. 20 corresponds to the embodiments in which there is one silicon soaking process performed after the plurality of ALD loops for forming metal-containing layer 64A. The X-axis represents the heights in the direction of arrow 84 in FIG. 19B. In accordance with some embodiments, although the elements in gate stack 70 diffuse away from where they are deposited, the silicon atomic percentage has a peak value in silicon layer 64B. The titanium atomic percentage has a peak value in metal-containing layer 64A assuming metal-containing layer 64A comprises titanium. The hafnium atomic percentage has a peak value in high-k dielectric layer 62B assuming high-k dielectric layer 62B comprises hafnium.

Figure 21:
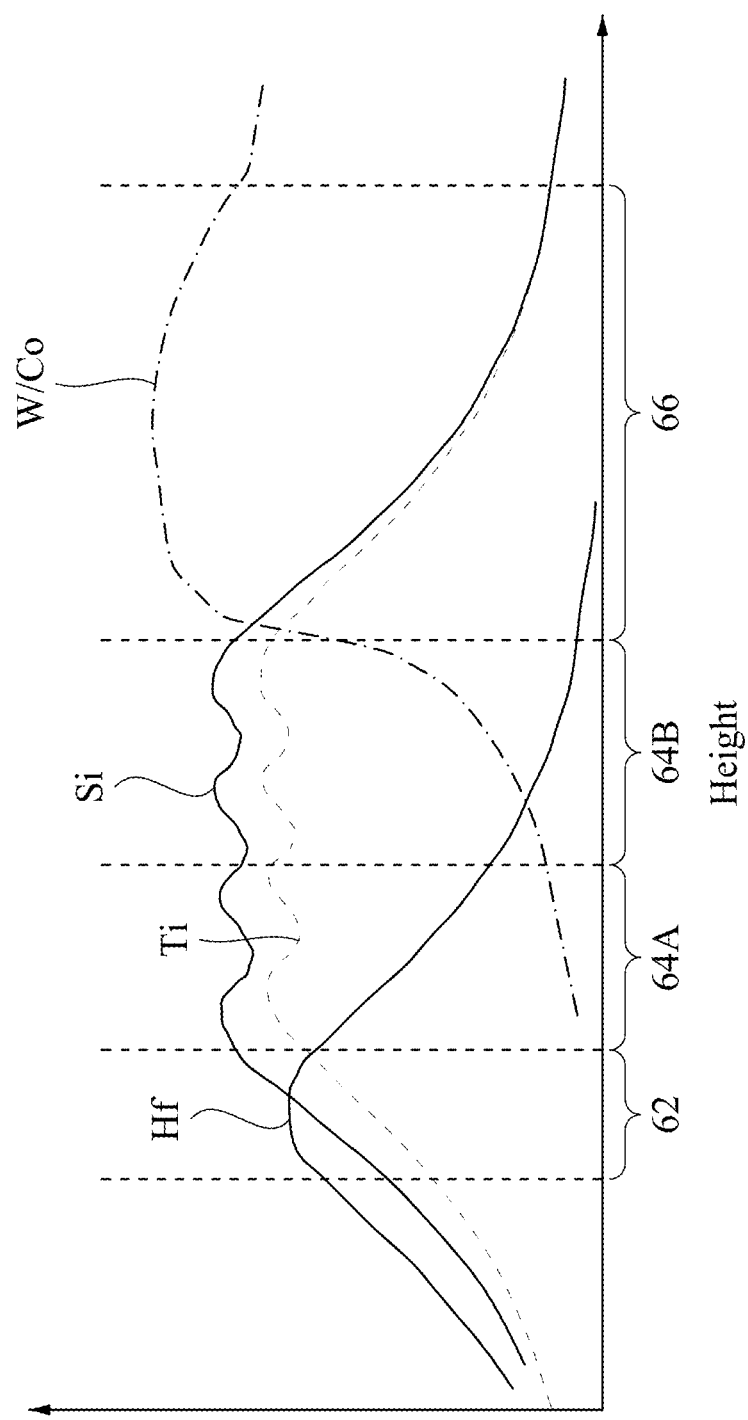

FIG. 21 illustrates the silicon atomic percentage, titanium atomic percentage, and hafnium atomic percentage in gate stacks 70 (FIG. 19B) as functions of height in accordance with alternative embodiments. FIG. 20 corresponds to the embodiments in which metal-containing layers 64A and silicon layers 64B are deposited alternatingly. Accordingly, there may be peaks of titanium and silicon in the alternating layers of metal-containing layer 66A and silicon layer 64B, respectively.

The embodiments of the present disclosure have some advantageous features. In conventional transistors, the work-function layers of n-type transistors include aluminum. The aluminum in the work-function layers may degrade the reliability of the gate stack such as reduce the Time-Dependent Dielectric Breakdown (TDDB) of the corresponding gate dielectric. By depositing silicon on an aluminum-free metal-containing layer in a gate stack of an n-type transistor, the work-function of the gate stack may be reduced to the desirable range for n-type transistors. Accordingly, aluminum-free work-function layers may be formed, and the reliability is improved. By in-situ depositing the metal-containing layer, the silicon-containing layer, and the glue layer, silicon-containing layer is not adversely oxidized.

In accordance with some embodiments of the present disclosure, a method comprises forming a dummy gate stack over a semiconductor region; forming a source/drain region on a side of the dummy gate stack; removing the dummy gate stack to form a trench; depositing a gate dielectric layer extending into the trench; depositing a metal-containing layer over the gate dielectric layer; depositing a silicon-containing layer on the metal-containing layer, wherein the metal-containing layer and the silicon-containing layer in combination act as a work-function layer; and performing a planarization process to remove excess portions of the silicon-containing layer, the metal-containing layer, and the gate dielectric layer, with remaining portions of the silicon-containing layer, the metal-containing layer, and the gate dielectric layer forming a gate stack. In an embodiment, the depositing the silicon-containing layer comprises soaking a corresponding wafer comprising the work-function layer in a silicon-containing process gas. In an embodiment, silicon-containing layer comprises elemental silicon. In an embodiment, after the metal-containing layer is deposited and before the silicon-containing layer is deposited, the metal-containing layer by itself has a p-type work function, and wherein the source/drain region is of n-type. In an embodiment, at a time after the planarization process is performed, the work-function layer has an n-type work-function. In an embodiment, the metal-containing layer is free from aluminum. In an embodiment, the depositing the metal-containing layer comprises depositing titanium nitride. In an embodiment, the depositing the metal-containing layer comprises depositing tantalum nitride. In an embodiment, the depositing the work-function layer is performed through atomic layer deposition. In an embodiment, a distance from a bottom surface of the silicon-containing layer to the semiconductor region is smaller than about 3 nm.

In accordance with some embodiments of the present disclosure, an integrated circuit structure comprises a semiconductor region; an n-type source/drain region on a side of the semiconductor region; and a gate stack over the semiconductor region, the gate stack comprising a gate dielectric; a metal-containing layer over the gate dielectric, wherein the metal-containing layer comprises a bottom portion over the gate dielectric; a first sidewall portion and a second sidewall portion over and connecting to opposite ends of the bottom portion; and a silicon layer over and physically contacting the metal-containing layer. In an embodiment, the integrated circuit structure further comprises a filling metal over and contacting the silicon layer. In an embodiment, the silicon layer comprises elemental silicon. In an embodiment, the metal-containing layer by itself has a p-type work function. In an embodiment, the metal-containing layer and the silicon layer collectively act as a work-function layer of a transistor comprising the gate stack and the n-type source/drain region, and the work-function layer has a work-function lower than a mid-gap work function of silicon. In an embodiment, silicon in the gate stack has a peak silicon atomic percentage in the silicon layer, and wherein silicon atomic percentage in the metal-containing layer is lower than the peak silicon atomic percentage. In an embodiment, the metal-containing layer comprises titanium nitride.

In accordance with some embodiments of the present disclosure, an integrated circuit structure comprises a semiconductor region; a first gate spacer and a second gate spacer over the semiconductor region; and a gate stack over the semiconductor region and between the first gate spacer and the second gate spacer, the gate stack comprising a high-k dielectric layer; a titanium nitride layer over and contacting the high-k dielectric layer; a silicon layer over and contacting the titanium nitride layer; and a filling metal region over and contacting the silicon layer. In an embodiment, the integrated circuit structure further comprises a source/drain region on a side of the gate stack, wherein the source/drain region is of n-type, and wherein the titanium nitride layer and the silicon layer in combination act as a work-function layer having an n-type work-function. In an embodiment, silicon has a peak silicon atomic percentage in the silicon layer, and wherein silicon atomic percentage reduces continuously into the filling metal region and the titanium nitride layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dummy gate stack over a semiconductor region;
   forming a source/drain region on a side of the dummy gate stack;
   removing the dummy gate stack to form a trench;
   depositing a gate dielectric layer extending into the trench;
   depositing a metal-containing layer over the gate dielectric layer;
   depositing a silicon-containing layer on the metal-containing layer, wherein the silicon-containing layer comprises elemental silicon, and the silicon-containing layer forms a ring encircling the semiconductor region, wherein both of the metal-containing layer and the silicon-containing layer are work-function layers; and
   performing a planarization process to remove excess portions of the silicon-containing layer, the metal-containing layer, and the gate dielectric layer, with remaining portions of the silicon-containing layer, the metal-containing layer, and the gate dielectric layer forming a gate stack.

2. The method of claim 1, wherein the depositing the silicon-containing layer comprises soaking a corresponding wafer comprising the metal-containing layer in a silicon-containing process gas.

3. The method of claim 1, wherein after the metal-containing layer is deposited and before the silicon-containing layer is deposited, the metal-containing layer by itself has a p-type work function, and wherein the source/drain region is of n-type.

4. The method of claim 3, wherein at a time after the planarization process is performed, the metal-containing layer and the silicon-containing layer collectively have an n-type work-function equal to or smaller than about 4.55 eV.

5. The method of claim 1, wherein the depositing the metal-containing layer comprises depositing titanium nitride.

6. The method of claim 1 further comprising depositing a glue layer over the silicon-containing layer, wherein the depositing the metal-containing layer, the depositing the silicon-containing layer, and the depositing the glue layer are in-situ performed in a same vacuum environment.

7. The method of claim 1, wherein the depositing the metal-containing layer is performed through atomic layer deposition.

8. The method of claim 1, wherein a distance from a bottom surface of the silicon-containing layer to the semiconductor region is smaller than about 3 nm.

9. An method comprising:
forming an n-type source/drain region on a side of a semiconductor region;
forming a gate stack over the semiconductor region, the forming the gate stack comprising:
forming a gate dielectric;
depositing a metal-containing layer over the gate dielectric, wherein the metal-containing layer comprises:
a bottom portion over the gate dielectric;
a first sidewall portion and a second sidewall portion over and connecting to opposite ends of the bottom portion; and
forming a silicon layer over and physically contacting the metal-containing layer, wherein in a cross-section of the silicon layer, the silicon layer forms a ring encircling the semiconductor region; and
forming a filling metal over the silicon layer, wherein the forming the filling metal and the forming the silicon layer are in-situ performed in different chambers without vacuum in between.

10. The method of claim 9, wherein the filling metal is in physical contact with the silicon layer.

11. The method of claim 9, wherein the forming silicon layer comprises depositing elemental silicon.

12. The method of claim 9, wherein the metal-containing layer has a p-type work function, and the metal-containing layer and the silicon layer collectively have an n-type work function.

13. The method of claim 9, wherein silicon in the gate stack has a peak silicon atomic percentage in the silicon layer, and wherein silicon atomic percentage in the metal-containing layer is lower than the peak silicon atomic percentage.

14. A method comprising:
forming a first gate spacer and a second gate spacer over a semiconductor region;
forming a gate stack over the semiconductor region and between the first gate spacer and the second gate spacer, the forming the gate stack comprising:
depositing a high-k dielectric layer;
depositing a titanium nitride layer over and contacting the high-k dielectric layer;
depositing a silicon layer over and directly contacting the titanium nitride layer, wherein the silicon layer comprises elemental silicon therein, and the silicon layer forms a ring encircling the semiconductor region; and
depositing a filling metal region over and contacting the silicon layer; and
forming a source/drain region on a side of the gate stack, wherein the source/drain region is of n-type, and wherein the titanium nitride layer and the silicon layer in combination act as a work-function layer that has an n-type work-function.

15. The method of claim 14, wherein silicon has a peak silicon atomic percentage in the silicon layer, and wherein silicon atomic percentage reduces continuously into the filling metal region and the titanium nitride layer.

16. The method of claim 9, wherein the silicon layer comprises a compound comprising silicon and nitrogen.

17. The method of claim 9, wherein at a time the filling metal is formed, the silicon layer is free from silicon oxide therein.

18. The method of claim 1 further comprising:
depositing an additional metal-containing layer over and contacting the silicon-containing layer; and
depositing an additional silicon-containing layer over and contacting the additional metal-containing layer, wherein the additional silicon-containing layer comprises elemental silicon.

* * * * *